(12) United States Patent
Matsumoto et al.

(10) Patent No.: US 7,723,142 B2
(45) Date of Patent: May 25, 2010

(54) GROWTH METHOD OF GAN CRYSTAL, AND GAN CRYSTAL SUBSTRATE

(75) Inventors: Naoki Matsumoto, Itami (JP); Fumitaka Sato, Itami (JP); Seiji Nakahata, Itami (JP); Takuji Okahisa, Itami (JP); Koji Uematsu, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 36 days.

(21) Appl. No.: 12/130,082

(22) Filed: May 30, 2008

(65) Prior Publication Data

US 2008/0296585 A1  Dec. 4, 2008

(30) Foreign Application Priority Data

Jun. 1, 2007  (JP) ............... 2007-147095

(51) Int. Cl.
H01L 21/00 (2006.01)
H01L 31/20 (2006.01)

(52) U.S. Cl. .......................................... 438/48; 257/62

(58) Field of Classification Search ................ 438/150, 438/166, 48, 482; 257/54–67, E21.09–E21.134
See application file for complete search history.

(56) References Cited

U.S. PATENT DOCUMENTS 6,413,627 B1 * 7/2002 Motoki et al. ............... 428/332

FOREIGN PATENT DOCUMENTS

| EP | 1 088 914 A1 | 4/2001 |
|----|--------------|--------|
| JP | 2005-200250 | 7/2005 |
| JP | 2006-143581 | 6/2006 |
| JP | 2006-290676 | 10/2006 |

OTHER PUBLICATIONS

B. Lucznik et al., "Deposition of Thick GaN Layers by HVPE on the Pressure Grown GaN Substrates", Journal of Crystal Groth, vol. 281, 2005, pp. 38-46.
L. Liu et al., "Substrates for Gallium Nitride Epitaxy", Materials Science and Engineering R: Reports, vol. 37, 2002, pp. 61-127.
P. Prystawko et al., "Doping of Homoepitaxial GaN Layers", Phys. Stat. Sol. B, vol. 210, 1998, pp. 437-443.

* cited by examiner

*Primary Examiner*—Calvin Lee
(74) *Attorney, Agent, or Firm*—Drinker Biddle & Reath LLP

(57) ABSTRACT

A method of producing a GaN crystal is directed to growing a GaN crystal on a GaN seed crystal substrate. The method includes the steps of preparing a GaN seed crystal substrate including a first dopant such that the thermal expansion coefficient of the GaN seed crystal substrate becomes greater than that of the GaN crystal, and growing the GaN crystal to a thickness of at least 1 mm on the GaN seed crystal substrate. Accordingly, there can be provided a method of producing a GaN crystal that can suppress generation of a crack and grow a thick GaN crystal, and a GaN crystal substrate.

6 Claims, 10 Drawing Sheets

GROWTH METHOD OF GAN CRYSTAL, AND GAN CRYSTAL SUBSTRATE

BACKGROUND OF THE INVENTION

1. Field of the Invention

The present invention relates to a growth method of a GaN crystal, and a GaN crystal substrate, conveniently employed for the substrate and the like of a semiconductor device such as a light emitting element, an electronic element and a semiconductor sensor.

2. Description of the Background Art

A GaN crystal substrate is extremely useful for the substrate of a semiconductor device such as a light emitting element, an electronic element and a semiconductor sensor. It is required to grow a GaN crystal of great thickness in order to produce such a GaN crystal substrate efficiently.

When a GaN crystal is grown on a substrate of a type differing in the chemical composition from the GaN crystal (for example, sapphire substrate, SiC substrate, and the like) (such growth is referred to as hetero growth), the mismatch in the lattice constant between the different-type substrate and GaN crystal will cause higher dislocation density of the GaN crystal to reduce the crystallinity. In addition, complicated steps such as formation of a buffer layer, formation of a mask layer and the like were required in order to reduce the dislocation density and improve the crystallinity of the GaN crystal to be grown. It was therefore difficult to grow a GaN crystal efficiently.

When a GaN crystal is grown on a GaN substrate that is identical in type with the chemical composition of the GaN crystal (such growth is referred to as homo growth), there was a problem that a crack may be generated in the GaN crystal. The generation of a crack is noticeable particularly in the case where the thickness of the homo-growing GaN crystal is 1 mm or more.

Japanese Patent Laying-Open No. 2005-200250 (hereinafter, referred to as Patent Document 1) discloses a method of growing a nitride semiconductor crystal that is uniform in quality and of high crystallinity by surrounding the growth face edge portion and side face portion of the growing crystal with a cover located apart by a predetermined distance, when a nitride semiconductor crystal is to be grown on a nitride semiconductor substrate, to prevent abnormal growth that occurs partially at the edge region of the growth face and side face of the growing crystal. However, it was difficult to suppress generation of a crack during the growth of a GaN crystal even by the method disclosed in Patent Document 1.

SUMMARY OF THE INVENTION

In view of the foregoing, an object of the present invention is to provide a growth method of a GaN crystal that can suppress generation of a crack and grow a thick GaN crystal, and a GaN crystal substrate.

The present invention is directed to a method of growing a GaN crystal on a GaN seed crystal substrate. The growth method of a GaN crystal includes the steps of preparing a GaN seed crystal substrate including a first dopant such that a thermal expansion coefficient of the GaN seed crystal substrate becomes greater than the thermal expansion coefficient of the GaN crystal, and growing a GaN crystal to a thickness of at least 1 mm on the GaN seed crystal substrate. The first dopant can include at least one type of element selected from the group consisting of In, P, Al, As, Sb, O and Si. The concentration of the first dopant can be set to at least $5 \times 10^{15}$ $cm^{-3}$ and not more than $5 \times 10^{19}$ $cm^{-3}$.

In the step of growing a GaN crystal in the growth method of a GaN crystal of the present invention, a second dopant can be added to the GaN crystal such that the thermal expansion coefficient of the GaN seed crystal substrate becomes greater than the thermal expansion coefficient of the GaN crystal. The second dopant can include at least one type of element selected from the group consisting of In, P, Al, As, Sb, O and Si. The first and second dopant can include the same type of element.

The present invention is also directed to a GaN crystal substrate obtained by processing the GaN crystal obtained by the growth method set forth above.

According to the present invention, a growth method of a GaN crystal that can suppress generation of a crack and grow a thick GaN crystal, and a GaN seed crystal substrate can be provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1A:
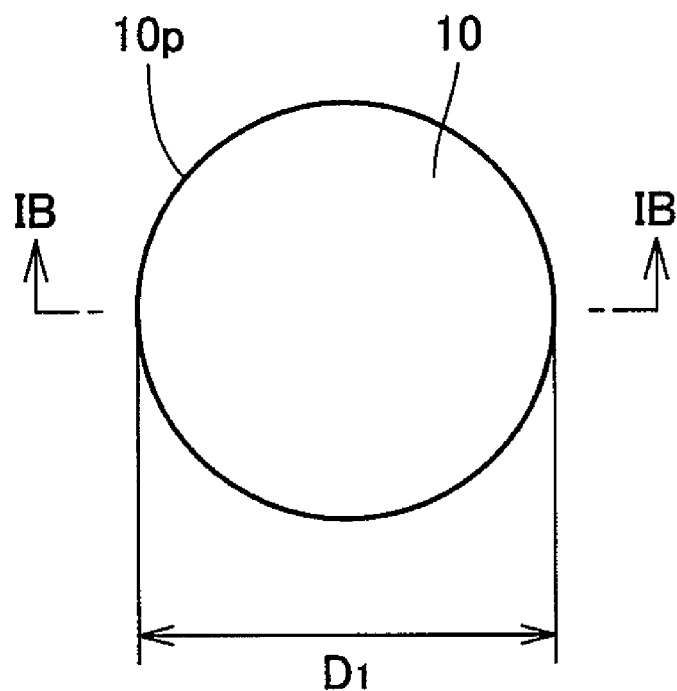
FIG. 1A is a schematic plan view of an example of a GaN seed crystal substrate employed in the present invention.
Figure 1B:
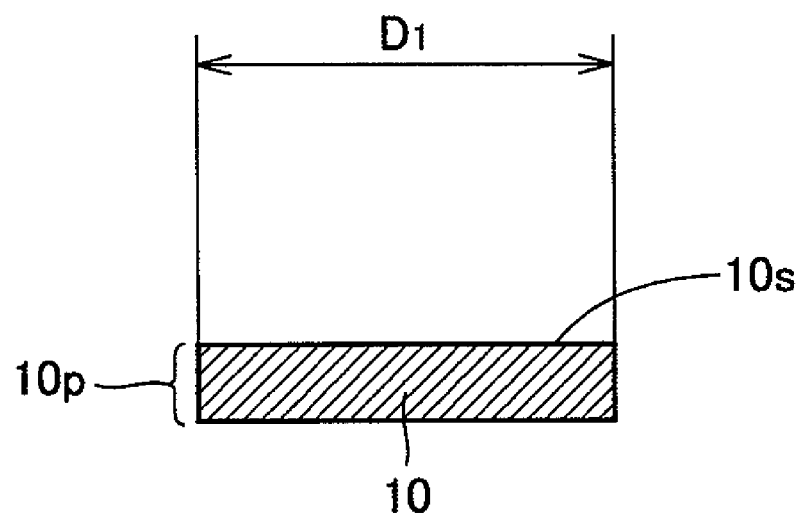
FIG. 1B is a schematic sectional view taken along line IB-IB of FIG. 1A.
Figure 2A:
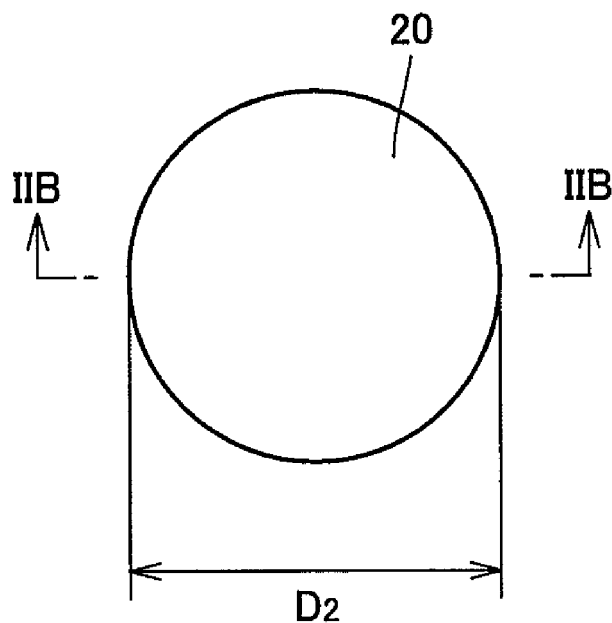
FIG. 2A is a schematic plan view of an embodiment of a growth method of a GaN crystal according to the present invention.
Figure 2B:
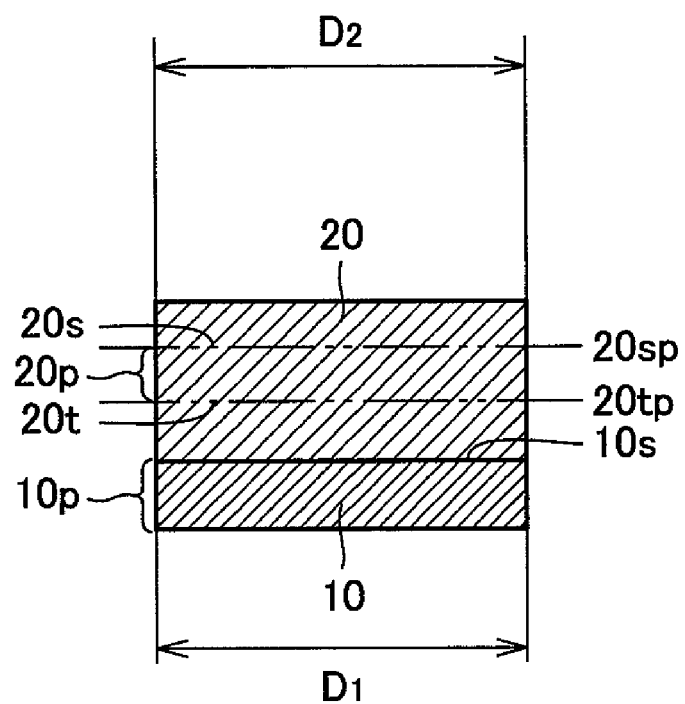
FIG. 2B is a schematic sectional view taken along line IIB-IIB of FIG. 2A.

Referring to FIGS. 1A, 1B, 2A and 2B, an embodiment of a growth method of a GaN crystal of the present invention is directed to a method of growing a GaN crystal 20 on a GaN seed crystal substrate 10$p$. The method includes the step of preparing GaN seed crystal substrate 10$p$ including a first dopant such that the thermal expansion coefficient of GaN seed crystal substrate 10$p$ becomes greater than that of GaN crystal 20 (FIGS. 1A and 1B), and the step of growing GaN crystal 20 to a thickness of at least 1 mm on GaN seed crystal substrate 10$p$ (FIGS. 2A and 2B).

By the inclusion of the first dopant in GaN seed crystal substrate 10$p$ according to a growth method of a GaN crystal of the present embodiment, the thermal expansion coefficient of GaN seed crystal substrate 10$p$ becomes greater than that of GaN crystal 20. Therefore, in the cooling process subsequent to the growth of GaN crystal 20, the shrinkage of GaN seed crystal substrate 10$p$ will become greater than that of GaN crystal 20, causing compression stress on GaN crystal 20. Thus, the generation of a crack is suppressed.

The first dopant in GaN seed crystal substrate 10$p$ is not particularly limited, as long as the thermal expansion coefficient of GaN seed crystal substrate 10$p$ becomes greater than that of GaN crystal 20. However, in view of the great increase in the thermal expansion coefficient, at least one type of element selected from the group consisting of In, P, Al, As, Sb, O and Si is preferable. A compound crystal formed of such dopant and Ga or N (nitrogen) has a thermal expansion coefficient greater than that of the GaN crystal. For example, the thermal expansion coefficient of a GaN crystal is $3.17 \times 10^{-6}$ C.$^{-1}$; whereas the thermal expansion coefficient of an InN crystal is $3.80 \times 10^{-6}$ C.$^{-1}$; the thermal expansion coefficient of a GaP crystal is $4.65 \times 10^{-6}$ C.$^{-1}$; the thermal expansion coefficient of an AlN crystal is $5.27 \times 10^{-6}$ C.$^{-1}$; the thermal expansion coefficient of an Si$_3$N$_4$ crystal is $3.20 \times 10^{-6}$ C.$^{-1}$; the thermal expansion coefficient of a GaAs crystal is $5.73 \times 10^{-6}$ C.$^{-1}$; the thermal expansion coefficient of a GaSb crystal is $7.75 \times 10^{-6}$ C.$^{-1}$; and the thermal expansion coefficient of a Ga$_2$O$_3$ crystal is $4.60 \times 10^{-6}$ C.$^{-1}$.

The concentration of the first dopant in GaN seed crystal substrate 10$p$ is preferably, though not particularly limited to, at least $5 \times 10^{15}$ cm$^{-3}$ and not more than $5 \times 10^{19}$ cm$^{-3}$. If the concentration of the dopant is lower than $5 \times 10^{15}$ cm$^{-3}$, the effect of increasing the thermal expansion coefficient of the GaN seed crystal substrate is reduced. If this concentration is higher than $5 \times 10^{19}$ cm$^{-3}$, the GaN seed crystal substrate will become brittle due to the solid solution hardening caused by the dopant. In this context, the concentration of the dopant is more preferably at least $1 \times 10^{17}$ cm$^{-3}$ and not more than $3 \times 10^{19}$ cm$^{-3}$.

As used herein, in order to facilitate comparison of the level of the thermal expansion coefficient, all references to the thermal expansion coefficient of each of GaN seed crystal substrate 10$p$ and GaN crystal 20 corresponds to the increased amount with respect to the thermal expansion coefficient of a GaN crystal to which a dopant is not added (hereinafter, referred to as "increased thermal expansion coefficient"; the value of an increased amount that is lower than 0, i.e. –, implies decrease).

Since the density of a GaN crystal is 3.04 g·cm$^{-3}$, the number of Ga atoms and N atoms included in the volume of 1 cm$^3$ thereof is $2.19 \times 10^{22}$ each. An increased thermal expansion coefficient $\Delta\lambda_{GaN(A)}$ of an A-containing GaN crystal when Xcm$^{-3}$ of A atoms, serving as the dopant, are added to the GaN crystal is calculated, using a thermal expansion coefficient $\lambda_A$ of the A crystal (a crystal having all the Ga atoms or N atoms of the GaN crystal substituted with the dopant of A atoms; the same applies hereinafter), and a thermal expansion coefficient $\lambda_{GaN}$ of the GaN crystal, by the following equation (1).

$$\Delta\lambda_{GaN(A)} = (\lambda_A - \lambda_{GaN}) \times X/(2.19 \times 10^{22}) \quad (1)$$

For example, in the case where Xcm$^{-3}$ of A atoms, serving as the dopant, are added to the GaN seed crystal substrate, and a dopant is not added to the GaN crystal, the difference $\Delta\lambda$ of the increased thermal expansion coefficient $\Delta\lambda_{GaN(A)}$ of the GaN seed crystal substrate with respect to the thermal expansion coefficient $\Delta\lambda_{GaN}$ of the GaN crystal is calculated by the following equation (2), since the increased thermal expansion coefficient $\Delta\lambda_{GaN(A)}$ of the GaN crystal is 0.

$$\Delta\lambda = (\Delta\lambda_{GaN(A)} - \Delta\lambda_{GaN}) = \Delta\lambda_{GaN(A)} \quad (2)$$

In the step of growing a GaN crystal in the growth method of a GaN crystal of the present embodiment, a second dopant can be added to the GaN crystal such that the thermal expansion coefficient of the GaN seed crystal substrate becomes greater than that of the GaN crystal. A GaN crystal having a physical property newly added by the addition of various dopants can be grown while suppressing crack generation.

The second dopant in the GaN crystal 20 is preferably, although not particularly limited to, at least one type of element selected from the group consisting of In, P, Al, As, Sb, O and Si in view of the great increase in the thermal expansion coefficient and feasible adjustment with respect to the thermal expansion coefficient of the GaN seed crystal substrate. The first and second dopants set forth above preferably include the same type of element from the standpoint of preventing mixture of different-type dopants into the GaN crystal.

In the case where X$_1$cm$^{-3}$ of A$_1$ atoms are added as the first dopant to the GaN seed crystal substrate and X$_2$cm$^{-3}$ of A$_2$ atoms are added as the second dopant to the GaN crystal, an increased thermal expansion coefficient $\Delta\lambda_{GaN(A1)}$ of the GaN seed crystal substrate is calculated, using a thermal expansion coefficient $\lambda_{A1}$ of the A$_1$ crystal (a crystal having all the Ga atoms or N atoms of the GaN crystal substituted with the dopant of A$_1$ atoms; the same applies hereinafter), and the thermal expansion coefficient $\lambda_{GaN}$ of the GaN crystal, is calculated by the following equation (3).

$$\Delta\lambda_{GaN(A1)} = (\lambda_{A1} - \lambda_{GaN}) \times X_1/(2.19 \times 10^{22}) \quad (3)$$

The increased thermal expansion coefficient $\Delta\lambda_{GaN(A2)}$ of the GaN crystal is calculated, using a thermal expansion coefficient $\lambda_{A2}$ of the $A_2$ crystal (a crystal having all the Ga atoms or N atoms of the GaN crystal substituted with the dopant of $A_2$ atoms; the same applies hereinafter), and the thermal expansion coefficient $\lambda_{GaN}$ of the GaN crystal, is calculated by the following equation (4).

$$\Delta\lambda_{GaN(A2)} = (\lambda_{A2} - \lambda_{GaN}) \times X_2/(2.19 \times 10^{22}) \quad (4)$$

The difference $\Delta\lambda$ of the increased thermal expansion coefficient $\Delta\lambda_{GaN(A1)}$ of the GaN seed crystal substrate with respect to the increased thermal expansion coefficient $\Delta\lambda_{GaN(A2)}$ of the GaN crystal is calculated by the following equation (5).

$$\Delta\lambda = \Delta\lambda_{GaN(A1)} - \Delta\lambda_{GaN(A2)} \quad (5)$$

In the growth method of a GaN crystal of the present embodiment, a GaN seed crystal substrate including a first dopant such that the thermal expansion coefficient of the GaN seed crystal substrate becomes greater than that of the GaN crystal (for example, a dopant including at least one type of element selected from the group consisting of In, P, Al, As, Sb, O and Si) is prepared, as one example, as set forth below.

A growth method of GaN seed crystal 10 including the first dopant employs, but is not particularly limited to, vapor phase deposition such as HVPE (Hydride Vapor Phase Epitaxy), MOC (Metal Organic Chloride Vapor Phase Epitaxy), and MOVPE (Metal Organic Vapor Phase Epitaxy), as well as the liquid phase deposition method such as the high pressure fusion method, flux method, and the like. In view of the high crystal growth rate and favorable efficiency in obtaining a thick crystal, the HVPE method is preferably employed.

Figure 3:
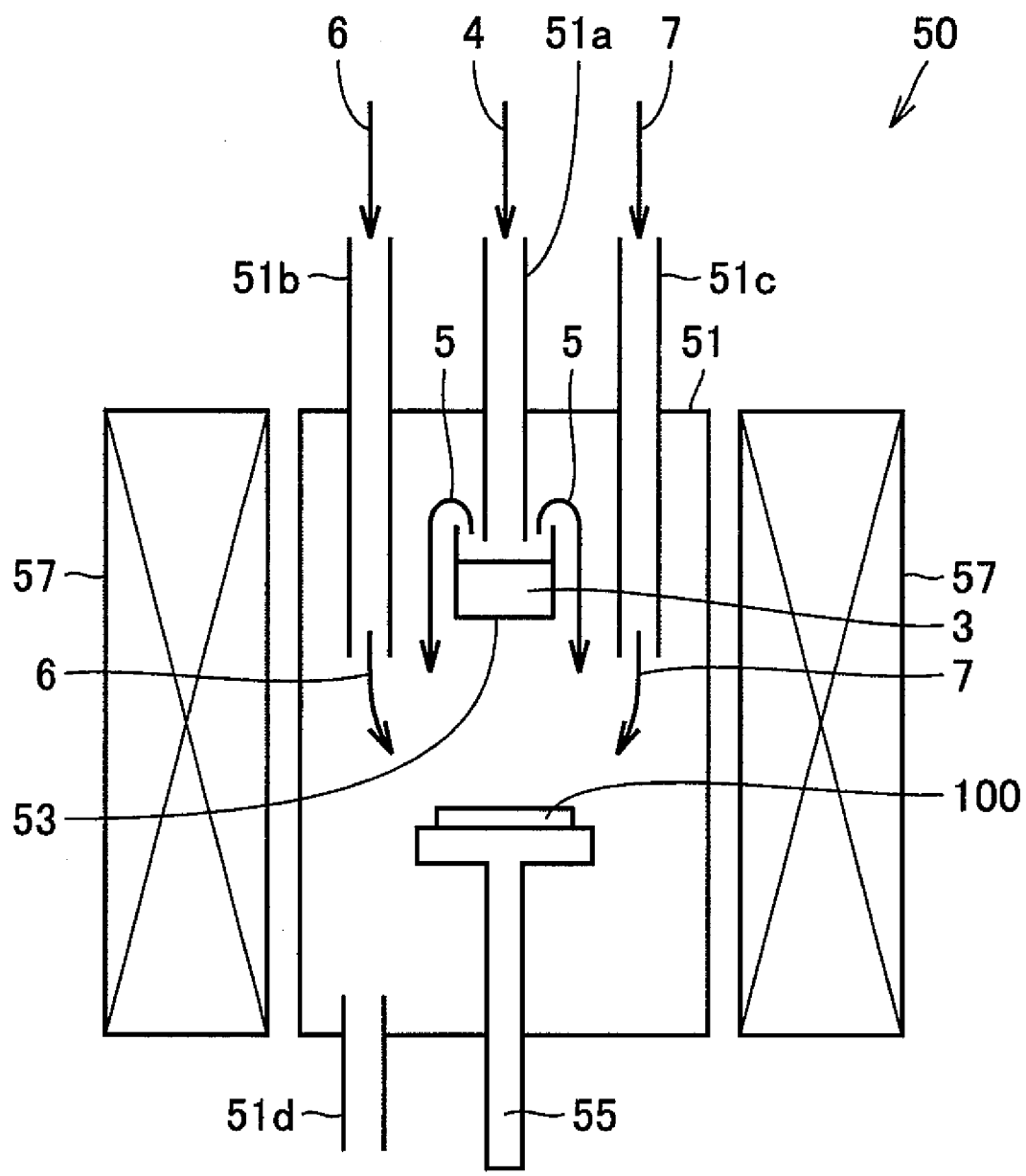
FIG. 3 is a schematic view of an example of a GaN seed crystal substrate and a growth apparatus of a GaN crystal of the present invention.

A GaN seed crystal 10 including at least one type of element selected from the group consisting of In, P, Al, As, Sb, O and Si as the first dopant can be grown, using a crystal growth apparatus 50 shown in FIG. 3 by employing both the HVPE method and MOC method.

Referring to FIG. 3, a crystal growth apparatus 50 used in the HVPE includes a susceptor 55 for placing a substrate 100 in a crystal growth vessel 51, an HCl gas introduction pipe 51a to introduce HCl gas 4 and carrier gas, an $NH_3$ gas introduction pipe 51b to introduce $NH_3$ gas 6 and carrier gas, a dopant gas introduction pipe 51c to introduce dopant gas 7, a Ga boat 53 for storing Ga 3 required to cause reaction with HCl gas 4 to generate Ga chloride (gallium chloride) gas 5, and an exhaust pipe 51d to exhaust the gas after reaction. A heater 57 to heat crystal growth vessel 51 is disposed at the outer periphery of crystal growth vessel 51.

With an underlying substrate 90 identified as substrate 100 heated to the temperature of at least 900° C. and not more than 1200° C., and Ga boat 53 heated to the temperature of at least 600° C. and not more than 1200° C., HCl gas 4 and carrier gas are introduced via HCl gas introduction pipe 51a, $NH_3$ gas 6 and carrier gas are introduced via $NH_3$ gas introduction pipe 51b, and a mixture gas of organic metal gas and HCl gas, qualified as dopant gas 7, is introduced via dopant gas introduction pipe 51c, into crystal growth vessel 51. HCl gas 4 reacts with Ga 3 in Ga boat 3 to be introduced into crystal growth vessel 51 as Ga chloride gas 5 (for example, GaCl gas and/or $GaCl_3$ gas). When a different-type substrate is employed, a GaAs substrate, a SiC substrate, a sapphire substrate or the like that has a lattice constant of low mismatch with that of the grown GaN crystal, is preferably employed for underlying substrate 90, though not to be taken by way of limitation.

In the case where mixture gas of organic metal gas and HCl gas is employed for dopant gas 7, the organic metal gas reacts with HCl gas to be introduced into crystal growth vessel 51 as metal chloride gas. For the carrier gas, gas that does not react with the Ga chloride gas, the $NH_3$ gas and the dopant gas such as $H_2$ gas, $N_2$ gas, and the like is preferably employed. The partial pressure of the Ga chloride gas is preferably at least 1.01 kPa (0.01 atm) and not more than 10.1 kPa (0.1 atm). The partial pressure of the $NH_3$ gas is preferably at least 10.1 kPa (0.1 atm) and not more than 60.8 kPa (0.6 atm). The total pressure including the carrier gas is preferably at least 53.69 kPa (0.53 atm) and not more than 105.35 kPa (1.04 atm).

By the reaction of Ga chloride gas 5, $NH_3$ gas 6 and dopant gas 7 introduced into crystal growth vessel 51 set forth above, GaN seed crystal 10 including at least one type of element selected from the group consisting of In, P, Al, As, Sb, O and Si, as the first dopant, is grown on underlying substrate 90.

A dopant can be added into GaN seed crystal 10 by the exemplified method set forth below. For doping In, mixture gas of TMI (trimethyl indium) gas and HCl gas, qualified as dopant gas 7, is introduced into dopant gas introduction pipe 51c to cause reaction between the TMI gas and HCl gas in the pipe. The produced In chloride gas (for example, InCl gas and/or $InCl_3$ gas) reacts with Ga chloride gas 5 and $NH_3$ gas 6. Thus, In doping is effected.

For doping Al, mixture gas of TMA (trimethyl aluminium) gas and HCl gas, qualified as dopant gas 7, is introduced into dopant gas introduction pipe 51c to cause reaction between the TMA gas and HCl gas in the pipe. The produced Al chloride gas (for example, $AlCl_3$ gas) reacts with Ga chloride gas 5 and $NH_3$ gas 6. Thus, Al doping is effected.

For doping P, mixture gas of organic metal gas and HCl is not introduced into dopant gas introduction pipe 51c as dopant gas 7. GaP is mixed with Ga 3 in Ga boat 53, and this GaP reacts with HCl gas 4 introduced via HCl gas introduction pipe 51a to produce phosphorus chloride gas (for example, $PCl_3$ gas). The produced phosphorus chloride gas reacts with Ga chloride gas 5 and $NH_3$ gas 6. Thus, P doping is effected.

For doping As, mixture gas of organic metal gas and HCl is not introduced into dopant gas introduction pipe 51c as dopant gas 7. GaAs is mixed with Ga 3 in Ga boat 53, and this GaAs reacts with HCl gas 4 introduced via HCl gas introduction pipe 51a to produce arsenic chloride gas (for example, $AsCl_3$ gas). The produced arsenic chloride gas reacts with Ga chloride gas 5 and $NH_3$ gas 6. Thus, As doping is effected.

For doping Sb, mixture gas of organic metal gas and HCl is not introduced into dopant gas introduction pipe 51c as dopant gas 7. GaSb is mixed with Ga 3 in Ga boat 53, and this GaSb reacts with HCl gas 4 introduced via HCl gas introduction pipe 51a to produce antimony chloride gas (for example, $SbCl_3$ gas). The produced antimony chloride gas reacts with Ga chloride gas 5 and $NH_3$ gas 6. Thus, Sb doping is effected.

For doping O, $O_2$ gas qualified as dopant gas 7 is introduced into crystal growth vessel 51 via dopant gas introduction pipe 51c to cause reaction with Ga chloride gas 5 and $NH_3$ gas 6. Thus, O doping is effected.

For doping Si, gas including Si such as $SiH_2$ gas, $SiCl_2H_2$ gas or $SiCl_4$ gas, qualified as dopant gas 7, is introduced into crystal growth vessel 51 via dopant gas introduction pipe 51c to cause reaction with Ga chloride gas 5 and $NH_3$ gas 6. Thus, Si doping is effected.

Figure 4A:
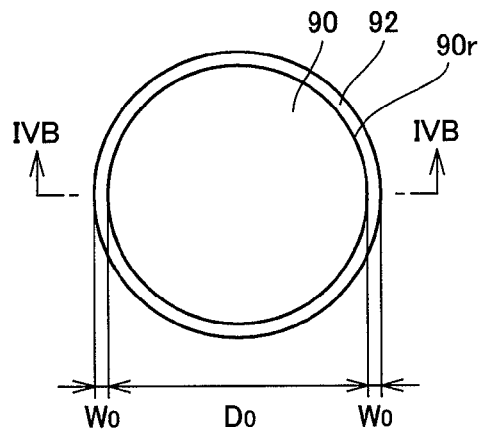
FIG. 4A is a schematic plan view representing an example of an underlying substrate and crystal growth suppression material employed in the growth method of a GaN seed crystal substrate employed in the present invention.
Figure 4B:
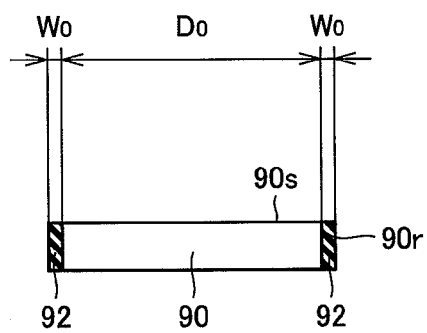
FIG. 4B is a schematic sectional view taken along line IVB-IVB of FIG. 4A.
Figure 5:
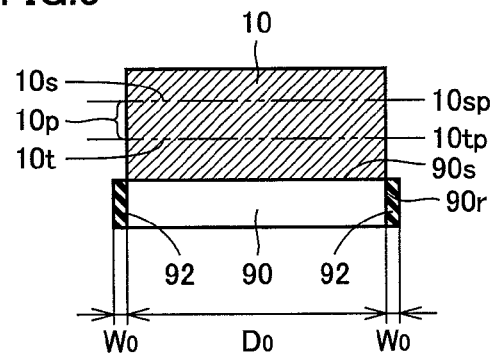
FIG. 5 is a schematic sectional view representing an example of a growth method of a GaN seed crystal employed in the present invention.

Referring to FIGS. 4A, 4B and 5, the GaN seed crystal substrate is preferably obtained as set forth below. Using a different-type substrate as underlying substrate 90, differing in the chemical composition from that of GaN, a crystal growth suppression material 92 is disposed in contact with an outer circumferential face 90r of underlying substrate 90 (refer to FIGS. 4A and 4B). GaN seed crystal 10 is grown on underlying substrate 90. GaN seed crystal 10 is sliced parallel to a main surface 90s of underlying substrate 90 (refer to FIG. 5). The different-type substrate employed for underlying substrate 90 is preferably, but not particularly limited to, a sapphire substrate, SiC substrate, GaAs substrate or the like in view of the low mismatch in the lattice constant with that of the grown GaN substrate. Crystal growth suppression material 92 includes, though not particularly limited to, BN, $SiO_2$, $Si_3N_4$, W (tungsten) and the like. By disposing a crystal growth suppression material in contact with the outer circumferential face of the underlying substrate, the growth of poly crystal partially at the outer circumference of the GaN seed crystal growing on the underlying layer can be suppressed. A GaN seed crystal of high crystallinity can be grown without generation of a crack.

Referring to FIG. 5, GaN seed crystal 10 obtained as set forth above is sliced at planes 10sp and 10tp parallel to main surface 90s of underlying substrate 90. Thus a GaN seed crystal substrate 10p having main surfaces 10s and 10t is obtained. The slicing method of GaN seed crystal 10 can be carried out by, but is not particularly limited to, a wire saw, inner diameter saw blade, outer diameter saw blade or by an electric discharge process. The thickness of GaN seed crystal substrate 10p is, though not particularly limited to, preferably at least 300 μm in view of the mechanical strength in handling. The surface of GaN seed crystal substrate 10p obtained as set forth above is rinsed with at least one of acidic solvent, alkaline solvent, organic solvent, and water.

Referring to FIGS. 2A and 2B, the growth method of a GaN crystal of the present embodiment preferably includes the step of removing a work-affected layer (not shown) located at the surface of GaN seed crystal substrate 10p prior to the step of growing GaN crystal 20 to a thickness of at least 1 mm on GaN seed crystal substrate 10p. The work-affected layer located at the surface of GaN seed crystal substrate 10p by the slicing process set forth above is preferably completely removed since it will cause many dislocations of GaN crystal 20 growing on GaN seed crystal substrate 10p.

This step of removing the work-affected layer can be carried out by dry-etching the surface of the GaN seed crystal substrate using HCl or $Cl_2$ gas. This removal can also be effected by wet-etching the surface of the GaN seed crystal substrate using phosphoric acid, sulfuric acid, KOH, NaOH, and the like. In addition, the removal can be effected by grinding and/or polishing the surface of the GaN seed crystal substrate.

The process of removing the work-affected layer is preferably carried out in a nitrogen gas or hydrogen gas atmosphere, establishing contact between the GaN seed crystal substrate heated to at least 700° C. and not more that 1200° C. and the HCl gas. Specifically, referring to FIG. 3, GaN seed crystal substrate 10p shown in FIGS. 1A and 1B, qualified as substrate 100, is disposed. With the temperature of GaN seed crystal substrate 10p set to at least 700° C. and not more than 1200° C., HCl gas is introduced together with $N_2$ gas qualified as the carrier gas onto GaN seed crystal substrate 10p using, for example, $NH_3$ gas introduction pipe 51b or dopant gas introduction pipe 51c.

The reason why $N_2$ gas is employed as the carrier gas is to set the atmosphere in crystal growth vessel 51 to a nitrogen gas atmosphere. By the work-affecting layer removal step on the GaN seed crystal substrate by the HCl gas in the nitrogen gas atmosphere, a flat GaN seed crystal substrate having a surface roughness Ra of 10 μm or below at the surface can be obtained. The partial pressure of the HCl gas is preferably at least 0.304 kPa (0.003 atm) and not more than 11.12 kPa (0.11 atm). The total pressure including $N_2$ gas or $H_2$ gas is preferably at least 53.69 kPa (0.53 atm) and not more than 105.35 kPa (1.04 atm). If the partial pressure of the HCl gas is lower than 0.304 kPa (0.003 atm), the time required to remove the work-affected layer will become longer, leading to higher cost. If the partial pressure is higher than 11.12 kPa, the surface of the GaN seed crystal substrate will be roughened, which is not preferable since it may become the cause of a defect in the growing GaN crystal.

If $H_2$ gas is employed as the carrier gas, the dropping of nitrogen atoms from the GaN seed crystal substrate will be increased to cause dropping of Ga. As a result, the planarity of the surface of the substrate will be degraded. Thus, $N_2$ gas is preferable than $H_2$ gas as the carrier gas. In view of preventing dropping of nitrogen atoms from the GaN seed crystal substrate, $NH_3$ gas may be mixed at a partial pressure of at least 0.304 kPa (0.003 atm) and not more than 11.14 kPa (0.11 atm).

The step of growing GaN crystal 20 to a thickness of at least 1 mm on GaN seed crystal substrate 10p in a growth method of a GaN crystal of the present embodiment will be described hereinafter with reference to FIGS. 2A and 2B. The growing method of GaN crystal 20 preferably employs, but is not particularly limited to, vapor phase deposition such as HVPE, MOC, and MOVPE, as well as the liquid phase deposition method such as the high pressure fusion method, flux method, and the like. In view of the high crystal growth rate and favorable efficiency in obtaining a thick crystal, the HVPE method is preferably employed.

GaN crystal 20 of at least 1 mm in thickness can be grown on GaN seed crystal substrate 10p as set forth below. Referring to FIGS. 2A, 2B and 3, GaN seed crystal substrate 10p qualified as substrate 100 is placed on susceptor 55 in crystal growth vessel 51 of crystal growth apparatus 50. With this GaN seed crystal substrate 10p heated to at least 900° C. and not more than 1200° C., Ga chloride gas 5 and $NH_3$ gas 6 are introduced to cause reaction, using inert gas such as $H_2$ gas or $N_2$ gas for the carrier gas. The partial pressure of Ga chloride gas is preferably at least 1.01 kPa (0.01 atm) and not more than 6.08 kPa (0.06 atm). The partial pressure of $NH_3$ gas is preferably at least 10.1 kPa (0.1 atm) and not more than 60.8 kPa (0.6 atm). The gas total pressure in crystal growth vessel 51 is preferably at least 53.69 kPa (0.53 atm) and not more than 105.35 kPa (1.04 atm).

As a second dopant, at least one type of element selected from the group consisting of In, P, Al, As, Sb, O and Si can be added to GaN crystal 20. The GaN crystal growth method, growth condition, dopant adding method, and adding conditions are similar to those set forth above of the growth of GaN seed crystal. In view of suppressing a crack in GaN crystal 20, the first and second dopants are preferably added such that the thermal expansion coefficient of GaN seed crystal substrate 10p becomes greater than that of GaN crystal 20, i.e. increased thermal expansion coefficient $\Delta\lambda_{GaN(A1)}$ of the GaN seed crystal substrate become greater than the increased thermal expansion coefficient $\Delta\lambda_{GaN(A2)}$ of the GaN crystal.

Second Embodiment

Another embodiment of a growth method of a GaN crystal of the present invention is directed to a method of growing GaN crystal 20 on GaN seed crystal substrate 10p with reference to FIGS. 6A, 6B, 7A and 7B. The method includes the step of preparing GaN seed crystal substrate 10p having a polycrystalline region 10b at an outer circumference (refer to FIGS. 6A and 6B), and the step of growing GaN crystal 20 to a thickness of at least 1 mm, having a polycrystalline region 20b at the circumference on GaN seed crystal substrate 10p (refer to FIGS. 7A and 7B).

By the growth method of a GaN crystal of the present embodiment, a GaN crystal of polycrystalline structure (polycrystalline region 20b of GaN crystal) is grown on polycrystalline region 10b of GaN seed crystal substrate 10p, and a GaN crystal of monocrystalline structure (monocrystalline region 20a of GaN crystal) is grown on a monocrystalline region 10a (the region excluding the outer circumferential polycrystalline region 20b from the entire GaN seed crystal substrate 10p) of GaN seed crystal substrate 10p.

Figure 6A:
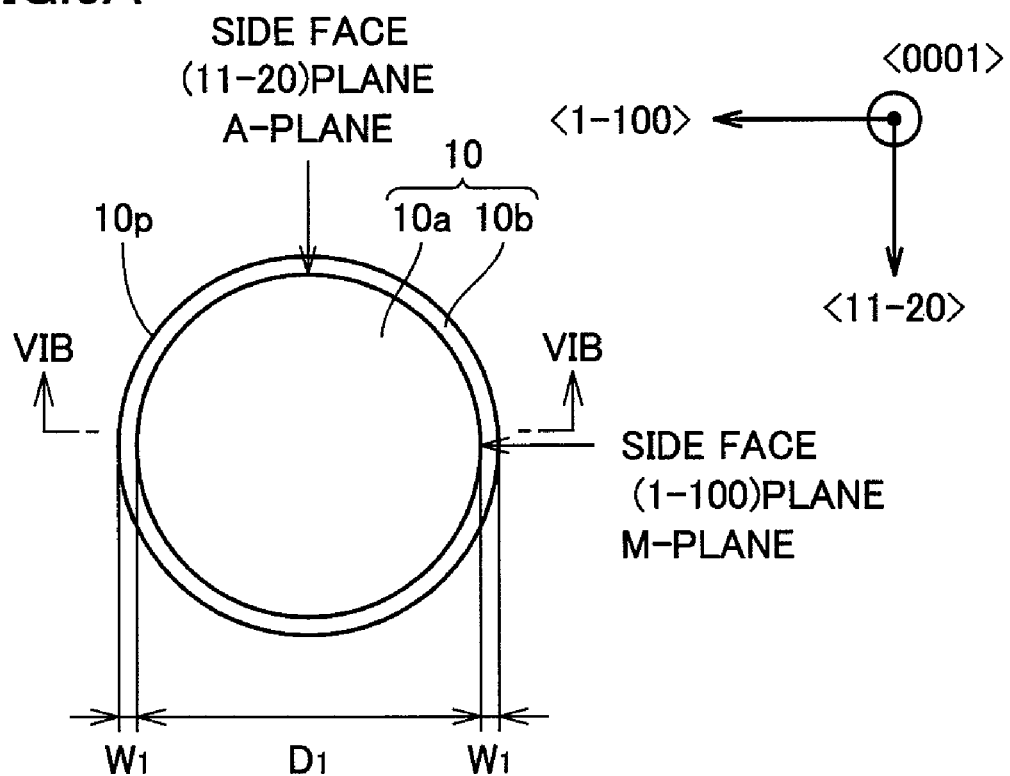
FIG. 6A is a schematic plan view representing another example of a GaN seed crystal substrate employed in the present invention.
Figure 6B:
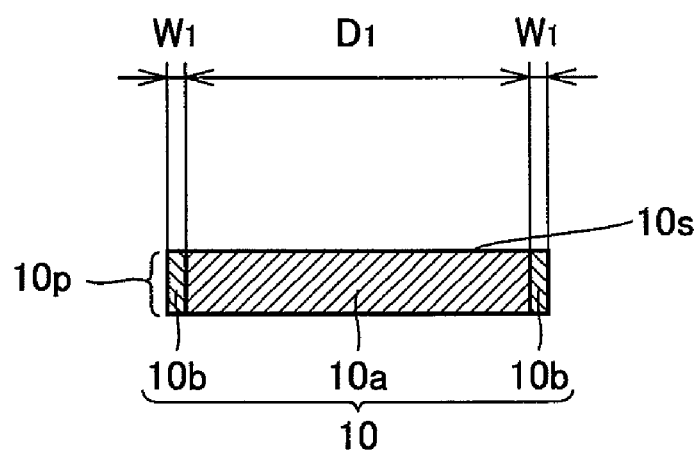
FIG. 6B is a schematic sectional view taken along line VIB-VIB of FIG. 6A.
Figure 7A:
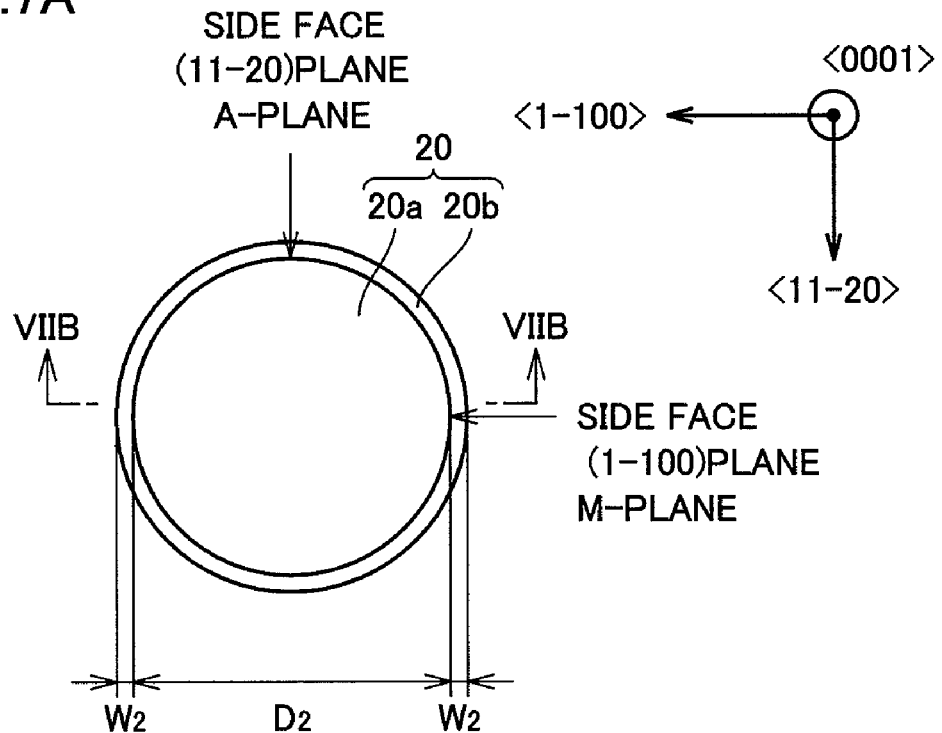
FIG. 7A is a schematic plan view representing another embodiment of a growth method of a GaN crystal according to the present invention.
Figure 7B:
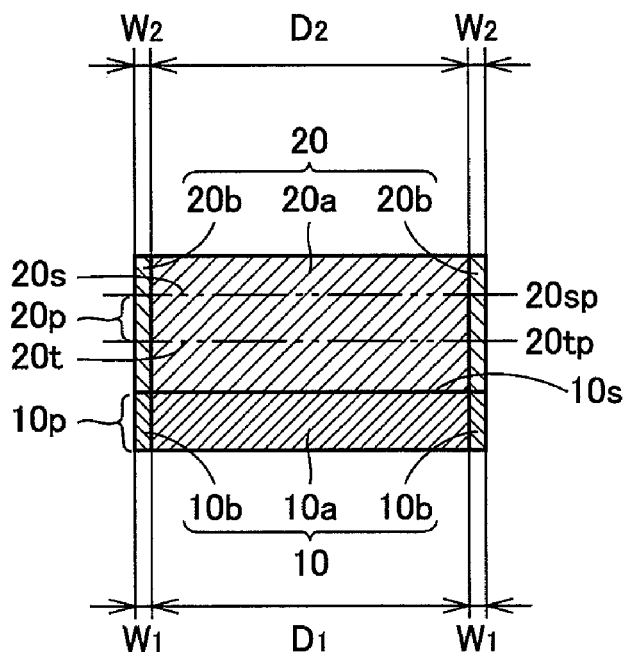
FIG. 7B is a schematic sectional view taken along line VIIB-VIIB of FIG. 7A.

Referring to FIGS. 6A and 6B, A-plane (for example, (11-20) plane) or M-plane (for example, (1-100) plane) that is a side face of GaN seed crystal substrate 10p with C-plane (for example, (0001) plane) as main surface 10s corresponds to polycrystalline region 10b. Therefore, polycrystalline region 20b of GaN crystal 20 grows entirely around the outer circumference of GaN seed crystal substrate 10p, as shown in FIGS. 7A and 7B. Therefore, GaN crystal 20 will not be grown locally at a certain region at the side face of GaN seed crystal substrate 10p. Stress will not be exerted in a concentrated manner at a certain region of the interface between C-plane and A- or M-plane of GaN seed crystal substrate 10p.

Referring to GaN crystal 20 in FIGS. 7A and 7B, the stress generated at the interface between C-plane (for example, (0001) plane) that is the growing face of GaN crystal 20 and A-plane (for example, (11-20) plane) or M-plane (for example, (1-100) plane) that is the side face of GaN crystal 20 is alleviated by polycrystalline region 20b located at the outer circumferential side, allowing the generation of a crack to be suppressed.

It is considered that polycrystalline region 10b located at the outer circumferential side of GaN seed crystal substrate 10p with reference to FIGS. 6A and 6B, i.e. the region having a plurality of grain boundaries, functions as a buffer material with respect to an externally applied impact during handling, processing, and the like of GaN seed crystal substrate 10p to suppress crack generation.

A growth method of a GaN crystal preferably employs, but is not particularly limited to, vapor phase deposition such as HVPE, MOC, and MOVPE, as well as the liquid phase deposition method such as the high pressure fusion method, flux method, and the like. In view of the high crystal growth rate and favorable efficiency in obtaining a thick crystal, the HVPE method is preferably employed.

Referring to FIGS. 6A and 6B, GaN seed crystal substrate 10p employed in the growth method of the GaN crystal of the present embodiment includes polycrystalline region 10b at the outer circumferential region, and monocrystalline region 10a at the center region. The width $W_1$ of polycrystalline region 10b located at the outer circumference of GaN seed crystal substrate 10p is preferably at least 0.03 mm and not more than 10 mm. If this width $W_1$ of polycrystalline region 10b is smaller than 0.03 mm, the polycrystalline region will be etched during growth of the GaN crystal to cause partial exposure of the monocrystalline region, which may lead to the generation of a crack. If the width is larger than 10 mm, more material will be consumed for the growth of the polycrystalline region, which will cause reduction in the growth rate of the monocrystalline region. The width $W_1$ of polycrystalline region 10b of GaN seed crystal substrate 10p is preferably uniform, and the ratio $W_{lmax}/W_{lmin}$ of the largest width to $W_{lmax}$ to the smallest width $W_{lmin}$ is not more than 5 times, preferably not more than 2 times, and more preferably not more than 1.4 times. Accordingly, the stress in GaN seed crystal substrate 10p will become uniform. This width $W_1$ of polycrystalline region 10b can be adjusted by working on the outer circumference that will be described afterwards.

The diameter $D_1$ of monocrystalline region 10a at the center area of GaN seed crystal substrate 10p is preferably at least 25 mm, and more preferably at least 50 mm, though not to be taken by way of limitation. If this diameter $D_1$ is smaller than 25 mm, the obtained GaN single crystal will become smaller.

The thickness of the GaN crystal to be grown on the GaN seed substrate is preferably at least 1 mm, more preferably at least 2 mm. If the thickness of the GaN crystal is lower than 1 mm, the fabrication cost will become higher if slicing is implemented since the number of substrates obtained by slicing is lower. A GaN crystal of at least 1 mm in thickness is advantageous in that, by virtue of the increased number of substrates obtained by slicing, the increase in the fabrication cost by the thicker crystal film and the processing cost by slicing can be absorbed by the advantage of the larger number of substrates obtained.

Referring to FIGS. 7A and 7B, by adjusting the growing condition of GaN crystal 20, the width $W_2$ of polycrystalline region 20b of GaN crystal 20 can be set equal to or different from the width $W_1$ of polycrystalline region 10b of GaN seed crystal substrate 10p, and the diameter $D_2$ of monocrystalline region 20a of GaN crystal 20 can be set equal to or different from the diameter $D_1$ of monocrystalline region 10a of GaN seed crystal substrate 10p.

Holes (not shown) may be provided in polycrystalline region 10b of GaN seed crystal substrate 10p and polycrystalline region 20b of GaN crystal 20. Holes in these polycrystalline regions 10b and 20b are advantageous in that the stress generated at the interface between C-plane and A- or M-plane of the GaN crystal, or the externally applied impact during handling, processing, and the like, may be further alleviated to further suppress generation of a crack.

GaN seed crystal substrate 10p having polycrystalline region 10b at the outer circumference can be obtained by any method, as long as the method does not infringe the object of the present invention. An exemplified method will be described hereinafter.

Figure 8A:
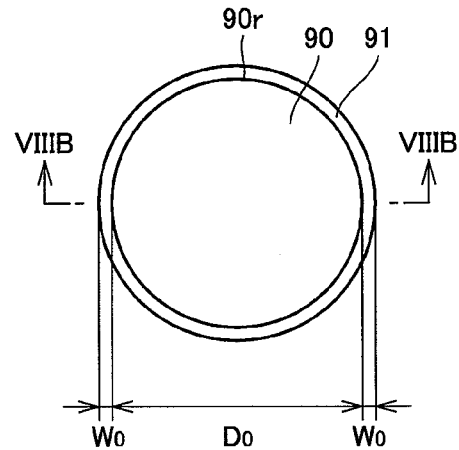
FIG. 8A is a schematic plan view representing an example of an underlying substrate and polycrystallization material employed in a growth method of a GaN seed crystal substrate employed in the present invention.
Figure 8B:
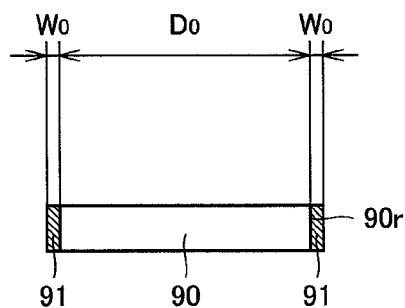
FIG. 8B is a schematic sectional view taken along line VIIIB-VIIIB of FIG. 8A.
Figure 9:
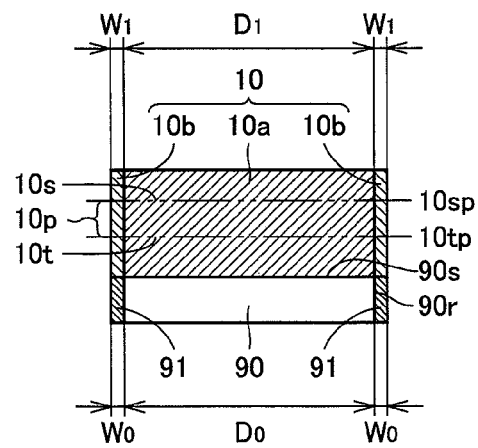
FIG. 9 is a schematic sectional view representing another example of a growth method of a GaN seed crystal employed in the present invention.

Referring to FIGS. 8A, 8B and 9, GaN seed crystal substrate 10p having main surfaces 10s and 10t can be obtained as set forth below. Using a different-type substrate as underlying substrate 90, differing in chemical composition from GaN, a polycrystallization material 91 is disposed in contact with an outer circumferential face 90r of underlying substrate 90 (refer to FIGS. 8A and 8B). GaN seed crystal 10 having a polycrystalline region 10b at the outer circumference is grown on underlying substrate 90 and polycrystallization material 91. That GaN seed crystal 10 is sliced at planes 10sp and 10tp parallel to main surface 90s of underlying substrate 90 (refer to FIG. 9). Alternatively, the outer circumference of GaN seed crystal 10 can be processed after growth of GaN seed crystal 10 to adjust the width $W_1$ of polycrystalline region 10b. GaN seed crystal 10 having the width $W_1$ of polycrystalline region 10b adjusted is sliced at planes 10sp and 10tp parallel to main surface 90s of underlying substrate 90 (refer to FIG. 9). Thus, GaN seed crystal substrate 10p can be obtained.

Figure 10A:
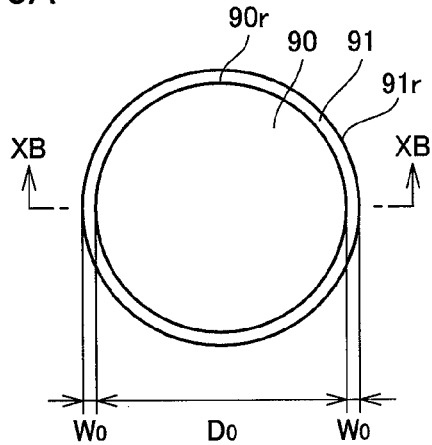
FIG. 10A is a schematic plan view representing another example of an underlying substrate and polycrystallization material employed in a growth method of a GaN seed crystal substrate employed in the present invention.
Figure 10B:
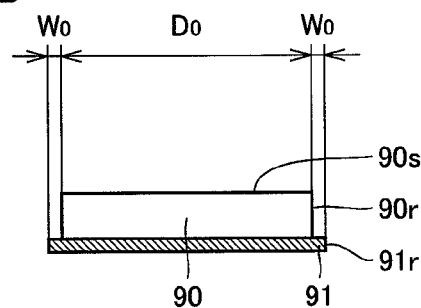
FIG. 10B is a schematic sectional view taken along line XB-XB of FIG. 10A.
Figure 11:
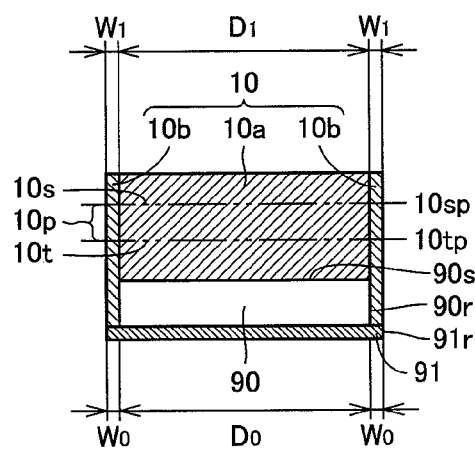
FIG. 11 is a schematic sectional view representing a further example of a growth method of a GaN seed crystal employed in the present invention.

Referring to FIGS. 10A, 10B and 11, GaN seed crystal substrate 10p having main surfaces 10s and 10t can be obtained as set forth below. Using a different-type substrate as underlying substrate 90, differing in chemical composition from GaN, a polycrystallization material 91 having an outer circumferential face 91r larger in diameter than that of outer circumferential face 90r of underlying substrate 90 is disposed below underlying substrate 90, such that outer circumferential face 91r of polycrystallization material 91 is located at an outer side than outer circumferential face 90r of underlying substrate 90 (refer to FIGS. 10A and 10B). GaN seed crystal 10 having polycrystalline region 10b at the outer circumference is grown on underlying substrate 90 and polycrystallization material 91. That GaN seed crystal 10 is sliced at planes 10sp and 10tp parallel to main surface 90s of underlying substrate 90 (refer to FIG. 11). Alternatively, the outer circumference of GaN seed crystal 10 can be processed after growth of GaN seed crystal 10 to adjust the width $W_1$ of polycrystalline region 10b. GaN seed crystal 10 having the width $W_1$ of polycrystalline region 10b adjusted is sliced at planes 10sp and 10tp parallel to main surface 90s of underlying substrate 90 (refer to FIG. 11). Thus, GaN seed crystal substrate 10p can be obtained.

The different-type substrate employed as underlying substrate 90 is, but not particularly limited to, a sapphire substrate, an SiC substrate, a GaAs substrate, and the like in view of the low mismatch in the lattice constant with the growing GaN crystal. For polycrystallization material 91 that is not particularly limited as long as it promotes polycrystallization of GaN seed crystal 10, alumina, mullite, solid carbon, or the like is preferably employed. By growing GaN seed crystal 10 on underlying substrate 90 and polycrystallization material 91, monocrystalline region 10a is formed on underlying substrate 90, and polycrystalline region 10b is formed on polycrystallization material 91. Thus, GaN seed crystal 10 having polycrystalline region 10b at the outer circumference is grown.

Figure 12A:
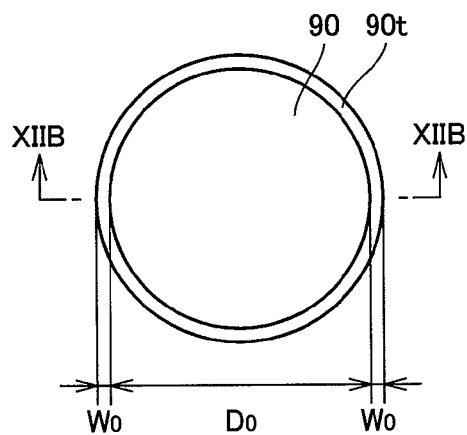
FIG. 12A is a schematic plan view representing an example of an underlying substrate employed in a growth method of a GaN seed crystal substrate employed in the present invention.
Figure 12B:
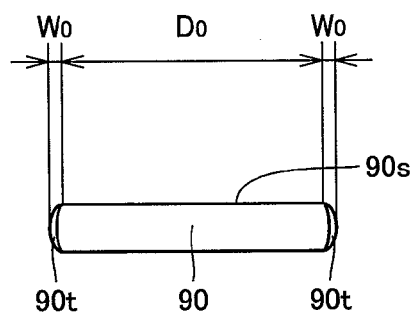
FIG. 12B is schematic sectional view taken along line XIIB-XIIB of FIG. 12A.
Figure 13:
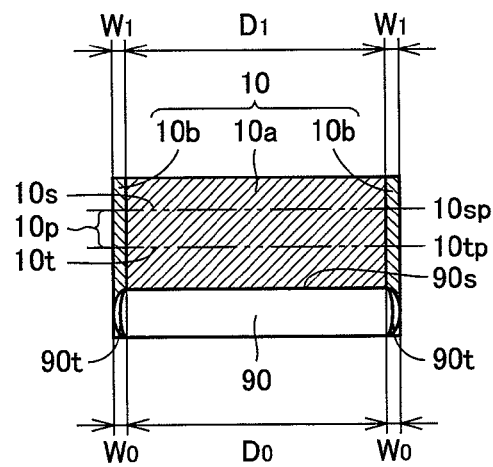
FIG. 13 is a schematic sectional view representing still another example of a growth method of a GaN seed crystal employed in the present invention.

Referring to FIGS. 12A, 12B and 13, GaN seed crystal 10p having the main surfaces 10s and 10t is obtained as set forth below. Using a different-type substrate as underlying substrate 90, differing in chemical composition from GaN, a work-affected layer 90t is formed at the outer circumference of underlying substrate 90 (refer to FIGS. 12A and 12B). GaN seed crystal 10 having polycrystalline region 10b at the outer circumference is grown on underlying substrate 90 where work-affected layer 90t is formed. The substrate is obtained by slicing at planes 10sp and 10tp parallel to main surface 90s of underlying substrate 90 (refer to FIG. 13). Alternatively, the outer circumference of GaN seed crystal 10 can be processed after growth of GaN seed crystal 10 to adjust the width $W_1$ of polycrystalline region 10b. GaN seed crystal 10 having the width $W_1$ of polycrystalline region 10b adjusted is sliced at planes 10sp and 10tp parallel to main surface 90s of underlying substrate 90 (refer to FIG. 13). Thus, GaN seed crystal substrate 10p can be obtained.

The method of growing a polycrystalline region on the other circumference of underlying substrate 90 is not particularly limited. In addition to forming a work-affected layer 90t at the outer circumference of underlying substrate 90, an underlying substrate 90 may be formed such that the surface at the outer circumference of underlying region 90 has a plane direction that does not cause growth of a GaN single crystal.

With regards to the growth of GaN seed crystal 10 shown in FIGS. 9, 11 and 13, GaN seed crystal 10 may be grown after applying a buffer layer, a mask layer, or the like (not shown) on underlying substrate 90.

The growth method of GaN seed crystal 10 employs, but is not particularly limited to, the vapor phase method such as HVPE, MOC and MOVPE. By adjusting the growing condition of GaN seed crystal 10, the width $W_1$ of polycrystalline region 10b of GaN seed crystal 10 can be set equal to or different from the width $W_0$ of polycrystallization material 91, and the diameter $D_1$ of monocrystalline region 10a of GaN seed crystal 10 can be set equal to or different from the diameter $D_0$ of underlying substrate 90.

A GaN seed crystal 10 including at least one type of element selected from the group consisting of In, P, Al, As, Sb, O and Si as the first dopant can be grown, using crystal growth apparatus 50 shown in FIG. 3 by employing both the HVPE method and MOC method.

Referring to FIG. 3, crystal growth apparatus 50 includes a susceptor 55 for placing a substrate 100 in a crystal growth vessel 51, an HCl gas introduction pipe 51a to introduce HCl gas 4 and carrier gas, an $NH_3$ gas introduction pipe 51b to introduce $NH_3$ gas 6 and carrier gas, a dopant gas introduction pipe 51c to introduce dopant gas 7, a Ga boat 53 for storing Ga 3 required to cause reaction with HCl gas 4 to generate Ga chloride (gallium chloride) gas 5, and an exhaust pipe 51d to exhaust the gas after reaction. A heater 57 to heat crystal growth vessel 51 is disposed at the outer periphery of crystal growth vessel 51.

Referring to FIGS. 3, 4A, and 4B, GaN seed crystal 10 including at least one type of element selected from the group consisting of In, P, Al, As, Sb, O and Si as the dopant can be grown specifically as set forth below. First, underlying substrate 90 having polycrystallization material 91 attached at the outer circumference is placed on susceptor 55 in crystal growth apparatus 51.

With underlying substrate 90 and polycrystallization material 91 heated to the temperature of at least 900° C. and not more than 1200° C., and Ga boat 53 heated to the temperature of at least 600° C. and not more than 1200° C., HCl gas 4 and carrier gas are introduced via HCl gas introduction pipe 51a, $NH_3$ gas 6 and carrier gas are introduced via $NH_3$ gas introduction pipe 51b, and a mixture gas of organic metal gas and HCl gas, qualified as dopant gas 7, is introduced via dopant gas introduction pipe 51c, into crystal growth vessel 51. HCl gas 4 reacts with Ga 3 in Ga boat 3 to be introduced into crystal growth vessel 51 as Ga chloride gas 5 (for example, GaCl gas and/or $GaCl_3$ gas).

In the case where mixture gas of organic metal gas and HCl gas is employed for dopant gas 7, the organic metal gas reacts with HCl gas to be introduced into crystal growth vessel 51 as metal chloride gas. For the carrier gas, gas that does not react with the Ga chloride gas, the $NH_3$ gas and the dopant gas such as $H_2$ gas, $N_2$ gas, and the like is preferably employed. The partial pressure of the Ga chloride gas is preferably at least 1.01 kPa (0.1 atm) and not more than 10.1 kPa (0.1 atm). The partial pressure of the $NH_3$ gas is preferably at least 10.1 kPa (0.1 atm) and not more than 60.8 kPa (0.6 atm). The total pressure including the carrier gas is preferably at least 53.69 kPa (0.53 atm) and not more than 105.35 kPa (1.04 atm).

By the reaction of Ga chloride gas 5, $NH_3$ gas 6 and dopant gas 7 introduced into crystal growth vessel 51 set forth above, GaN seed crystal 10 including at least one type of element selected from the group consisting of In, P, Al, As, Sb, O and Si, as the dopant, is grown on underlying substrate 90 and polycrystallization material 91.

A dopant can be added into GaN seed crystal 10 by the exemplified method set forth below. For doping In, mixture gas of TMI (trimethyl indium) gas and HCl gas, qualified as dopant gas 7, is introduced into dopant gas introduction pipe 51c to cause reaction between the TMI gas and HCl gas in the pipe. The produced In chloride gas (for example, InCl gas and/or $InCl_3$ gas) reacts with Ga chloride gas 5 and $NH_3$ gas 6. Thus, In doping is effected.

For doping Al, mixture gas of TMA (trimethyl aluminium) gas and HCl gas, qualified as dopant gas 7, is introduced into dopant gas introduction pipe 51c to cause reaction between the TMA gas and HCl gas in the pipe. The produced Al chloride gas (for example, $AlCl_3$ gas) reacts with Ga chloride gas 5 and $NH_3$ gas 6. Thus, Al doping is effected.

For doping P, mixture gas of organic metal gas and HCl is not introduced into dopant gas introduction pipe 51c as dopant gas 7. GaP is mixed with Ga 3 in Ga boat 53, and this GaP reacts with HCl gas 4 introduced via HCl gas introduction pipe 51a to produce phosphorus chloride gas (for example, $PCl_3$ gas). The produced phosphorus chloride gas reacts with Ga chloride gas 5 and $NH_3$ gas 6. Thus, P doping is effected.

For doping As, mixture gas of organic metal gas and HCl is not introduced into dopant gas introduction pipe 51c as dopant gas 7. GaAs is mixed with Ga 3 in Ga boat 53, and this GaAs reacts with HCl gas 4 introduced via HCl gas introduction pipe 51a to produce arsenic chloride gas (for example, $AsCl_3$ gas). The produced arsenic chloride gas reacts with Ga chloride gas 5 and $NH_3$ gas 6. Thus, As doping is effected.

For doping Sb, mixture gas of organic metal gas and HCl is not introduced into dopant gas introduction pipe 51c as dopant gas 7. GaSb is mixed with Ga 3 in Ga boat 53, and this GaSb reacts with HCl gas 4 introduced via HCl gas introduction pipe 51a to produce antimony chloride gas (for example, $SbCl_3$ gas). The produced antimony chloride gas reacts with Ga chloride gas 5 and $NH_3$ gas 6. Thus, Sb doping is effected.

For doping O, $O_2$ gas qualified as dopant gas 7 is introduced into crystal growth vessel 51 via dopant gas introduction pipe 51c to cause reaction between Ga chloride gas 5 and $NH_3$ gas 6. For doping Si, $SiH_2$ gas, qualified as dopant gas 7, is introduced into crystal growth vessel 51 via dopant gas introduction pipe 51c to cause reaction between Ga chloride gas 5 and $NH_3$ gas 6. Thus, Si doping is effected.

In addition, Si doping can be effected by introducing gas including Si such as $SiH_2$ gas, $SiCl_2H_2$ gas, and $SiCl_4$ gas, qualified as dopant gas 7, into crystal growth vessel 51 via dopant gas introduction pipe 51c to cause reaction between Ga chloride gas 5 and $NH_3$ gas 6.

GaN seed crystal 10 with polycrystalline region 10b at the outer circumference, obtained as set forth above, has the width $W_1$ of polycrystalline region 10b adjusted by an outer circumference processing method set forth below. For this outer circumference processing method, three methods, i.e. the peripheral grinding method grinding the polycrystalline region at the outer circumference with a grindstone, the crystal hollowing method of hollowing the GaN seed crystal such that the width of the polycrystalline region attains a predetermined width, and the discharge processing method grinding the polycrystalline region at the outer circumference by electric discharging, are preferably cited, though not to be taken by way of limitation Referring to FIGS. 9, 11 and 13, GaN seed crystal 10 having the width $W_1$ of polycrystalline region 10b adjusted is sliced at planes 10sp and 10tp parallel to main surface 90s of underlying substrate 90. Thus, GaN seed crystal substrate 10p having main surface 10s and 10t can be obtained. The slicing method of GaN seed crystal 10 can be carried out by, but is not particularly limited to, a wire saw, inner diameter saw blade, outer diameter saw blade or by an electric discharge process. The thickness of GaN seed crystal substrate 10p is, though not particularly limited to, preferably at least 300 µm in view of the mechanical strength in handling. The surface of GaN seed crystal substrate 10p obtained as set forth above is rinsed with at least one of acidic solvent, alkaline solvent, organic solvent, and water.

Referring to FIGS. 7A and 7B, the growth method of a GaN crystal of the present embodiment preferably includes the step of removing a work-affected layer (not shown) located at the surface of GaN seed crystal substrate 10p, prior to the step of growing GaN crystal 20 to a thickness of at least 1 mm, having a polycrystalline region 20b at the circumference on GaN seed crystal substrate 10p. The work-affected layer located at the surface of GaN seed crystal substrate 10p by the slicing process set forth above is preferably completely removed since it will cause many dislocations of GaN crystal 20 growing on GaN seed crystal substrate 10p.

This step of removing the work-affected layer can be carried out by dry-etching the surface of the GaN seed crystal substrate using HCl or $Cl_2$ gas. This removal can also be effected by wet-etching the surface of the GaN seed crystal substrate using phosphoric acid, sulfuric acid, KOH, NaOH, and the like. In addition, the removal can be effected by grinding and/or polishing the surface of the GaN seed crystal substrate.

The process of removing the work-affected layer is preferably carried out in a nitrogen gas or hydrogen gas atmosphere, establishing contact between the GaN seed crystal substrate heated to at least 700° C. and not more that 1200° C. and the HCl gas. Specifically, referring to FIG. 3, GaN seed crystal substrate 10p shown in FIGS. 6A and 6B, qualified as substrate 100, is disposed. With the temperature of GaN seed crystal substrate 10p set to at least 700° C. and not more than 1200° C., HCl gas is introduced together with $N_2$ gas qualified as carrier gas onto GaN seed crystal substrate 10p using, for example, $NH_3$ gas introduction pipe 51b or dopant gas introduction pipe 51c.

The reason why $N_2$ gas is employed as the carrier gas is to set the atmosphere in crystal growth vessel 51 to a nitrogen gas atmosphere. By the work-affecting layer removal step on the GaN seed crystal substrate by the HCl gas in the nitrogen gas atmosphere, a flat GaN seed crystal substrate having a surface roughness Ra of 10 µm or below at the surface can be obtained. The partial pressure of the HCl gas is preferably at least 0.304 kPa (0.003 atm) and not more than 11.12 kPa (0.11 atm). The total pressure including $N_2$ gas or $H_2$ gas is preferably at least 53.69 kPa (0.53 atm) and not more than 105.35 kPa (1.04 atm). If the partial pressure of the HCl gas is lower than 0.304 kPa (0.003 atm), the time required to remove the work-affected layer will become longer, leading to higher cost. If the partial pressure is higher than 11.12 kPa, the surface of the GaN seed crystal substrate will be roughened, which is not preferable since it may become the cause of a defect of the growing GaN crystal.

If $H_2$ gas is employed as the carrier gas, the dropping of nitrogen atoms from the GaN seed crystal substrate will be increased to cause dropping of Ga. As a result, the planarity of the surface of the substrate will be degraded. Thus, $N_2$ gas is preferable than $H_2$ gas as the carrier gas. In view of preventing dropping of nitrogen atoms from the GaN seed crystal substrate, $NH_3$ gas may be mixed at a partial pressure of at least 0.304 kPa (0.003 atm) and not more than 11.14 kPa (0.11 atm).

The step of growing GaN crystal 20 to a thickness of at least 1 mm, having polycrystalline region 20b at the circumference, on GaN seed crystal substrate 10p, having polycrystalline region 10b at the circumference, in a growth method of a GaN crystal of the present embodiment will be described hereinafter with reference to FIGS. 7A and 7B. The growing method of GaN crystal 20 preferably employs, but is not particularly limited to, vapor phase deposition such as HVPE, MOC, and MOVPE, as well as the liquid phase deposition method such as the high pressure fusion method, flux method, and the like. In view of the high crystal growth rate and favorable efficiency in obtaining a thick crystal, the HVPE method is preferably employed.

GaN crystal 20 of at least 1 mm in thickness, having polycrystalline region 20b at the circumference, can be grown on GaN seed crystal substrate 10p as set forth below. Referring to FIG. 3, GaN seed crystal substrate 10p, having polycrystalline region 10b at the circumference, qualified as substrate 100, is placed on susceptor 55 in crystal growth vessel 51 of crystal growth apparatus 50. With this GaN seed crystal substrate 10p heated to at least 900° C. and not more than 1200° C., Ga chloride gas 5 and NH₃ gas 6 are introduced to cause reaction, using inert gas such as H₂ gas or N₂ gas for the carrier gas. The partial pressure of Ga chloride gas is preferably at least 1.01 kPa (0.01 atm) and not more than 6.08 kPa (0.06 atm). The partial pressure of NH₃ gas is preferably at least 10.1 kPa (0.1 atm) and not more than 60.8 kPa (0.6 atm). The gas total pressure in crystal growth vessel 51 is preferably at least 53.69 kPa (0.53 atm) and not more than 105.35 kPa (1.04 atm).

As a second dopant, at least one type of element selected from the group consisting of In, P, Al, As, Sb, O and Si can be added to GaN crystal 20. The GaN crystal growth method, growth condition, dopant adding method, and adding conditions are similar to those set forth above of the growth of GaN seed crystal. In view of suppressing a crack in the GaN crystal, the first and second dopants are preferably added such that the thermal expansion coefficient of GaN seed crystal substrate 10p becomes greater than that of GaN crystal 20, i.e. increased thermal expansion coefficient $\Delta\lambda_{GaN(A1)}$ of the GaN seed crystal substrate become greater than the increased thermal expansion coefficient $\Delta\lambda_{GaN(A2)}$ of the GaN crystal.

By adjusting the growing condition of GaN crystal 20, the width $W_2$ of polycrystalline region 20b of GaN crystal 20 can be set equal to or different from the width $W_1$ of GaN seed crystal substrate 10p, and the diameter $D_2$ of monocrystalline region 20a of GaN crystal 20 can be set equal to or different from the diameter $D_1$ of monocrystalline region 10a of GaN seed crystal substrate 10p.

Third Embodiment

Figure 14:
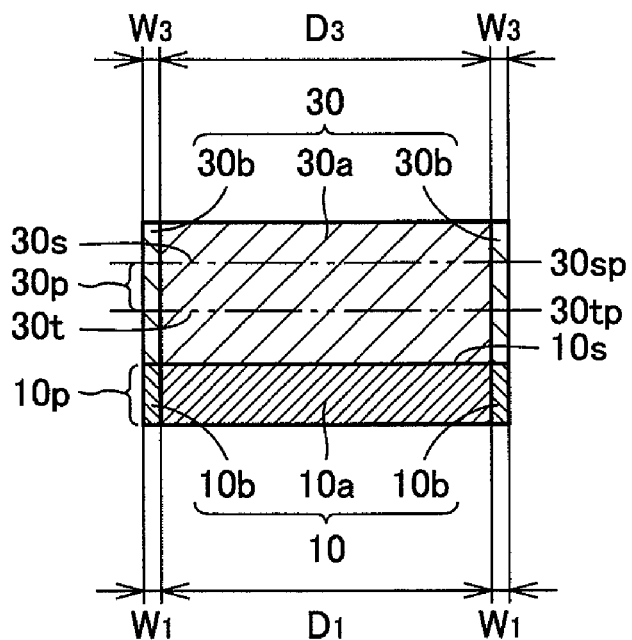
FIGS. 14 and 15 are schematic sectional views representing still another embodiment of a growth method of a GaN crystal according to the present invention.

A further embodiment of a growth method of a GaN crystal according to the present invention includes the steps of processing the outer circumference of GaN crystal 20 and GaN seed crystal substrate 10p to adjust widths $W_2$ and $W_1$ of polycrystalline region 20b and 10b, respectively, with reference to FIG. 7B, and growing a second GaN crystal 30 to a thickness of at least 1 mm, having a polycrystalline region 30b of a width $W_3$ at the outer circumference, with reference to FIG. 14, on GaN seed crystal substrate 10p having the width $W_1$ of polycrystalline region 10b adjusted, from which GaN crystal 20 having the width $W_2$ of polycrystalline region 20b adjusted is separated. Specifically, GaN seed crystal substrate 10p employed in the growth of GaN crystal 20 shown in FIG. 7B is repeatedly employed as GaN seed crystal substrate 10p directed to growing second GaN crystal 30 in FIG. 14. Thus, the growth efficiency of GaN crystal can be improved.

The method of adjusting widths $W_2$ and $W_1$ of polycrystalline regions 20b and 10b, respectively, by processing the outer circumference of GaN crystal 20 and GaN seed crystal substrate 10p can be carried out by employing a method similar to that of the second embodiment. The separation of GaN crystal 20 from GaN seed crystal substrate 10p can be effected by a slicing method similar to that of the first and second embodiments. Removal of a work-affected layer of GaN seed crystal 10 from which GaN crystal 20 is separated can be carried out by a method similar to that of the first and second embodiments. By adjusting the growth conditions of second GaN crystal 30, the width $W_3$ of polycrystalline region 30b of second GaN crystal 30 can be set equal to or different from the width $W_1$ of GaN seed crystal substrate 10p, and the diameter $D_3$ of monocrystalline region 30a of second GaN crystal 30 can be set equal to or different from the diameter $D_1$ of monocrystalline region 10a of GaN seed crystal substrate 10p. The first dopant and the second dopant can be applied to GaN seed crystal substrate 10p and second GaN crystal 30, respectively, such that the thermal expansion coefficient of GaN seed crystal substrate 10p becomes greater than that of second GaN crystal 30.

Fourth Embodiment

Figure 15:
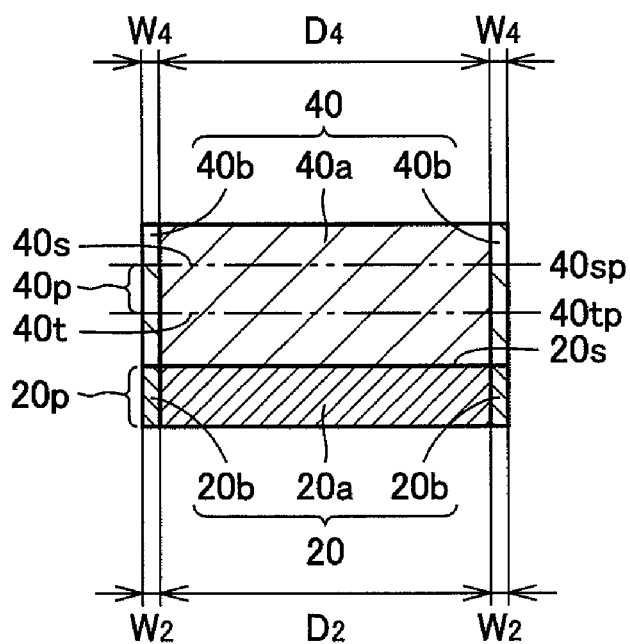

Still another embodiment of a growth method of a GaN crystal according to the present invention includes the steps set forth below. Referring to FIG. 7B, the outer circumference of GaN crystal 20 and GaN seed crystal substrate 10p is processed to adjust widths $W_2$ and $W_1$ of polycrystalline regions 20b and 10b. GaN crystal substrate 20p having main surfaces 20s and 20t, obtained by slicing GaN crystal 20 having the width $W_2$ of polycrystalline region 20b adjusted at planes 20sp and 20tp parallel to main surface 10s of GaN seed crystal substrate 10p, is prepared as the second GaN seed crystal substrate. Referring to FIG. 15, a third GaN crystal 40 having a polycrystalline region 40b of a width $W_4$ at the outer circumference is grown to a thickness of at least 1 mm on the second seed crystal substrate (GaN crystal substrate 20p).

Specifically, GaN crystal 20 obtained by the growth method of the first embodiment is sliced at planes 20sp and 20tp parallel to main surface 10s of GaN seed crystal substrate 10p. Using this GaN crystal substrate 20p having main surfaces 20s and 20t as the second GaN seed crystal substrate, third GaN crystal 40 is grown. Thus, the growth efficiency of the GaN crystal can be further improved.

The method of adjusting widths $W_2$ and $W_1$ of polycrystalline regions 20b and 10b by processing the outer circumference of GaN crystal 20 and GaN seed crystal substrate 10p is similar to that described with reference to the second embodiment. Slicing GaN crystal substrate 20p from GaN crystal 20 can be effected by a method similar to that of the first and second embodiments. Also, removal of the work-affected layer of GaN crystal substrate 20p can be carried out by a method similar to that of the first and second embodiments. By adjusting the growing conditions of third GaN crystal 40, the width $W_4$ of polycrystalline region 40b of third GaN crystal 40 can be set equal to or different from the width $W_2$ of GaN crystal substrate 20p, and the diameter $D_4$ of monocrystalline region 40a of second GaN crystal 40 can be set equal to or different from the diameter $D_2$ of monocrystalline region 20a of GaN crystal substrate 20p. The first and second dopants can be added to GaN crystal substrate 20p and third GaN crystal 40, respectively, so that the thermal expansion coefficient of GaN crystal substrate 20p becomes greater than that of third GaN crystal 40.

Fifth Embodiment

An embodiment of a GaN crystal substrate of the present invention corresponds to GaN crystal substrates 20p, 30p and 40p obtained by processing GaN crystal 20 (refer to FIGS. 2A, 2B, 7A and 7B) according to the growth method of the first and second embodiments, second GaN crystal 30 (refer to FIG. 14) according to the growth method of the third embodiment, or third GaN crystal 40 (refer to FIG. 15) according to the growth method of the fourth embodiment. Specifically, GaN crystal substrate 20p having main surface 20s and 20t is obtained by slicing GaN crystal 20 at planes 20sp and 20tp parallel to main surface 10s of GaN seed crystal substrate 10p, as shown in FIGS. 2A, 2B, 7A and 7B. GaN crystal substrate 30p having main surfaces 30s and 30t is obtained by slicing GaN crystal 30 shown in FIG. 14 at planes 30sp and 30tp parallel to main surface 10s of GaN seed crystal substrate 10p. GaN crystal substrate 40p having main surfaces 40s and 40t is obtained by slicing GaN crystal 40 shown in FIG. 15 at planes 40sp and 40tp parallel to main surface 20s of GaN crystal substrate 20p.

Some of monocrystalline regions 10a, 20a, 30a, and 40a in GaN seed crystal 10 and GaN crystals 20, 30 and 40 of the present invention may include a crystal that has the <0001> direction opposite to that of the adjacent crystal.

EXAMPLES

Examples 1-12, Comparative Example 1

1. Preparation of GaN Seed Crystal Substrate

Referring to FIGS. 3, 8A, 8B and 9, a SiC substrate of 50.8 mm in diameter $D_o$, qualified as an underlying substrate 90, was disposed, and an $SiO_2$ material of 5 mm in width $W_o$, qualified as crystal growth suppression material 92, was disposed in contact with outer circumferential face 90r of underlying substrate 90, constituting substrate 100 on susceptor 55 in crystal growth vessel 51 of crystal growth apparatus 50. Then, underlying layer 90 and crystal growth suppression material 92 were heated to 1000° C. With a hydrogen atmosphere of 101.3 kPa (1 atm) in total pressure using $H_2$ gas as the carrier gas, Ga chloride gas 5 (partial pressure: 2.03 kPa (0.02 atm)) and $NH_3$ gas 6 (partial pressure: 30.4 kPa (0.3 atm)) were introduced into crystal growth vessel 51 to grow a GaN seed crystal (seed crystal A). In the case where doping is to be effected, dopant gas 7 was further introduced as set forth below to grow a GaN seed crystal (seed crystals B-H).

Each dopant for the GaN seed crystal was added in a manner similar to that of the first embodiment. Referring to FIG. 3, for doping In (seed crystal B) and Al (seed crystal C), the mixture gas of TMI gas and HCl gas, and the mixture gas of the TMA gas and HCl gas, respectively, qualified as dopant gas 7, were introduced. For doping P (seed crystal D), As (seed crystal E) and Sb (seed crystal F), powder of GaP, GaAs and GaSb, respectively, were mixed with Ga 3. For doping O (seed crystal G) and Si (seed crystal H), $O_2$ gas and $SiH_2$ gas, respectively, qualified as dopant gas 7, were introduced. The employed powder of GaP, GaAs and GaSb had the average grain size of 0.5 μm and below.

Although monocrystalline GaN seed crystal 10 was grown on underlying substrate 90, GaN particles of approximately 0.1 μm to 1 mm in diameter were partially attached to the circumference thereof (not shown).

The GaN particles (not shown) adhering to the outer circumference of GaN seed crystal 10 were carefully removed using tweezers or file. Then, the crystal was sliced at planes 10sp and 10tp parallel to main surface 90s of underlying substrate 90. The surface was rinsed with hydrochloric acid (acid), KOH, NaOH (alkali) and ethanol (organic solvent). Seven GaN seed crystal substrates 10p, each having a thickness of 350 μm and a diameter 38 mm, were obtained. The generation of a crack in the obtained GaN seed crystal substrates 10p was evaluated. The crack generation rate was 43% for seed crystal substrate Ap (substrate obtained from seed crystal A, the same applies hereinafter), 57% for seed crystal substrate Bp (substrate obtained by seed crystal B; the same applies hereinafter), 57% for seed crystal substrate Cp (substrate obtained from seed crystal C; the same applies hereinafter), 71% for seed crystal substrate Dp (substrate obtained from seed crystal D; the same applies hereinafter), 57% for seed crystal substrate Ep (substrate obtained from seed crystal E; the same applies hereinafter), 57% for seed crystal substrate Fp (substrate obtained from seed crystal F; the same applies hereinafter), 43% for seed crystal substrate Gp (substrate obtained from seed crystal G; the same applies hereinafter), and 57% for seed crystal substrate Hp (substrate obtained from seed crystal H; the same applies hereinafter). The results are indicated in Table 1. As used herein, the crack generation rate (unit: %) refers to the percentage of the number of GaN crystal substrates $S_c$ that has at least one crack of at least 50 μm in length among the obtained number of GaN crystal substrates $S_o$, and is defined by the equation of:

$$\text{Crack generation rate}(\%) = 100 \times S_c/S_o \quad (6)$$

The crack was measured by a differential interference microscope.

The dopant concentration of each obtained GaN seed crystal substrate 10p was analyzed by SIMS (Secondary Ion Mass Spectroscopy). The concentration of In, P, Al, As, Sb, O and Si dopants were all at most $1 \times 10^{16}$ cm$^{-3}$ for seed crystal substrate Ap. For seed crystal substrate Bp, the In concentration was $2.4 \times 10^{18}$ cm$^{-3}$. For seed crystal substrate Cp, the Al concentration was $5.3 \times 10^{17}$ cm$^{-3}$. For seed crystal substrate Dp, the P concentration was $1.4 \times 10^{18}$ cm$^{-3}$. For seed crystal substrate Ep, the As concentration was $7.5 \times 10^{16}$ cm$^{-3}$. For seed crystal substrate Fp, the Sb concentration was $3.7 \times 10^{16}$ cm$^{-3}$. For seed crystal substrate Gp, the O concentration was $7.2 \times 10^{18}$ cm$^{-3}$. For seed crystal substrate Hp, the Si concentration was $4.3 \times 10^{18}$ cm$^{-3}$.

The increased thermal expansion coefficient $\Delta\lambda_{GaN(A1)}$ of each obtained GaN seed crystal substrate 10p was calculated using equation (3). Specifically, the increased thermal expansion coefficient $\Delta\lambda_{GaN(A1)}$ for seed crystal substrate Ap was 0° C.$^{-1}$, for seed crystal substrate Bp $6.9 \times 10^{-11}$° C.$^{-1}$, for seed crystal substrate Cp $5.1 \times 10^{-11}$° C.$^{-1}$, for seed crystal substrate Dp $9.5 \times 10^{-11}$° C.$^{-1}$, for seed crystal substrate Ep $8.8 \times 10^{-12}$° C.$^{-1}$, for seed crystal substrate Fp $7.7 \times 10^{-12}$° C.$^{-1}$, for seed crystal substrate Gp $4.7 \times 10^{-10}$° C.$^{-1}$, and for seed crystal substrate Hp $5.9 \times 10^{-12}$° C.$^{-1}$. The results are indicated in Table 1.

TABLE 1

| GaN Seed Crystal Substrate | Substrate designation | | Seed crystal substrate Ap | Seed crystal substrate Bp | Seed crystal substrate Cp | Seed crystal substrate Dp | Seed crystal substrate Ep | Seed crystal substrate Fp | Seed crystal substrate Gp | Seed crystal substrate Hp |
|---|---|---|---|---|---|---|---|---|---|---|
| | Type of underlying substrate | | SiC | SiC | SiC | SiC | SiC | SiC | SiC | SiC |
| | Presence of polycrystalline region | | none | none | none | none | none | none | none | None |
| | First dopant | Type | none | In | Al | P | As | Sb | O | Si |
| | | Concentration (cm$^{-3}$) | — | $2.4 \times 10^{18}$ | $5.3 \times 10^{17}$ | $1.4 \times 10^{18}$ | $7.5 \times 10^{16}$ | $3.7 \times 10^{16}$ | $7.2 \times 10^{18}$ | $4.3 \times 10^{18}$ |

TABLE 1-continued

| | | | | | | | | |
|---|---|---|---|---|---|---|---|---|
| Increased thermal expansion coefficient $\Delta\lambda_{GaN(A1)}$ (° C.$^{-1}$) | 0 | $6.9 \times 10^{-11}$ | $5.1 \times 10^{-11}$ | $9.5 \times 10^{-11}$ | $8.8 \times 10^{-12}$ | $7.7 \times 10^{-12}$ | $4.7 \times 10^{-10}$ | $5.9 \times 10^{-12}$ |
| Number of obtained substrates | 7 | 7 | 7 | 7 | 7 | 7 | 7 | 7 |
| Number of substrates with cracks | 3 | 4 | 4 | 5 | 4 | 4 | 3 | 4 |
| Crack generation rate (%) | 43 | 57 | 57 | 71 | 57 | 57 | 43 | 57 |

2. Removal of Work-Affected Layer at Surface of GaN Seed Crystal Substrate

Comparative Example 1 will be described with reference to FIG. 3. A seed crystal substrate Ap (GaN seed crystal substrate 10p) having a diameter $D_0$ of 38 mm with no polycrystalline adhered at the outer circumference, qualified as substrate 100, was placed on susceptor 55 in crystal growth vessel 51 of crystal growth apparatus 50, and heated to 950° C. With a nitrogen atmosphere of 101.3 kPa (1 atm) in total pressure using $N_2$ gas as the carrier gas, HCl gas (partial pressure: 70.9 kPa (0.7 atm)) was introduced to remove the work-affected layer from the surface. This removal of the work-affected layer was confirmed by observing the surface of the GaN seed crystal substrate by means of cathode luminance (CL). In a manner similar to that of Comparative Example 1, the work-affected layer was removed from the surface of each substrate (Examples 1-12), provided that seed crystal substrates Bp-Hp were employed as the GaN seed crystal substrate instead of seed crystal substrate Ap.

3. Growth of GaN Crystal

For Comparative Example 1 with reference to FIG. 3, a seed crystal substrate Ap (GaN seed crystal substrate 10p) of 38 mm in diameter, having the work-affected layer removed from the surface, qualified as substrate 100, was placed on susceptor 55 in crystal growth vessel 51 of crystal growth apparatus 50, and heated to 1000° C. With a hydrogen atmosphere of 101.3 kPa (1 atm) in total pressure using $H_2$ gas as the carrier gas, Ga chloride gas 5 (partial pressure: 3.04 kPa (0.03 atm)) and $NH_3$ gas 6 (partial pressure: 13.7 kPa (0.135 atm)) were introduced to grow a GaN crystal (Comparative Example 1). With regards to the crystal growth conditions, the crystal growth rate was 100 μm/hr. A GaN crystal of approximately 10 mm in thickness was obtained by conducting crystal growth for 100 hours. Polycrystalline GaN of approximately 0.2 μm to 1 mm adhered partially to the outer circumference of the obtained GaN crystal. The GaN crystal was subjected to the processes of removing the crystal adhering to the outer circumference, slicing, and rinsing in a manner similar to that described above. Seven GaN crystal substrates, each of 350 μm in thickness, were obtained. The crack generation rate of the GaN crystal substrates was 86%. The increased thermal expansion coefficient $\Delta\lambda_{GaN(A2)}$ of the GaN crystal obtained in Comparative Example 1 was 0 from equation (4). The difference $\Delta\lambda$ of increased thermal expansion coefficient $\Delta\lambda_{GaN(A1)}$ of seed crystal substrate Ap (GaN seed crystal substrate 10p) with respect to the increased thermal expansion coefficient $\Delta\lambda_{GaN(A2)}$ of GaN crystal 20 was 0 from equation (5). The results are shown in Table 2.

Respective GaN crystals were grown in a manner similar to that of Comparative Example 1, provided that seed crystal substrate Bp (Example 1), seed crystal substrate Cp (Example 2), seed crystal substrate Dp (Example 3), seed crystal substrate Ep (Example 4), seed crystal substrate Fp (Example 5), seed crystal substrate Gp (Example 6) and seed crystal substrate Hp (Example 7) were employed, instead of seed crystal substrate Ap (Comparative Example 1), for the GaN seed crystal substrate. Likewise with Comparative Example 1, the crystal growth rate was 100 μm/hr for all Examples 1-7. A GaN crystal of approximately 10 mm in thickness was obtained by conducting crystal growth for 100 hours. Polycrystalline GaN of approximately 0.2 μm to 1 mm adhered partially to the outer circumference of the obtained GaN crystal. In a manner similar to that described above, the GaN crystal was subjected to the processes of removing the crystal adhering to the outer circumference, slicing, and rinsing. Seven GaN crystal substrates, each of 350 μm in thickness, were obtained. The crack generation rate of the GaN crystal substrates was 29% for Examples 1-5 and 7, and 14% for Example 6.

Since the increased thermal expansion coefficient $\Delta\lambda_{GaN(A2)}$ of each GaN crystal obtained in Examples 1-7 were 0, the difference $\Delta\lambda$ of increased thermal expansion coefficient $\Delta\lambda_{GaN(A1)}$ of each GaN seed crystal substrate to increased thermal expansion coefficient $\Delta\lambda_{GaN(A2)}$ of each GaN crystal was, from equation (5), calculated as $6.9 \times 10^{-11}$° C.$^{-1}$ for Example 1, $5.1 \times 10^{-11}$° C.$^{-1}$ for Example 2, $9.5 \times 10^{-11}$° C.$^{-1}$ for Example 3, $8.8 \times 10^{-12}$° C.$^{-1}$ for Example 4, $7.7 \times 10^{-12}$° C.$^{-1}$ for Example 5, $4.7 \times 10^{-10}$° C.$^{-1}$ for Example 6, and $5.9 \times 10^{-12}$° C.$^{-1}$ for Example 7. The results are shown in Table 2.

In addition, for Examples 8-12, GaN crystals having various dopants added were grown under growth conditions similar to those of Comparative Example 1 on a GaN seed crystal substrate of respective types. A GaN crystal doped with As of $2.0 \times 10^{16}$ cm$^{-3}$ was grown on seed crystal substrate Ep in Example 8. A GaN crystal doped with O of $4.5 \times 10^{18}$ cm$^{-3}$ was grown on seed crystal substrate Gp in Example 9. A GaN crystal doped with Si of $2.0 \times 10^{18}$ cm$^{-3}$ was grown on seed crystal substrate Hp in Example 10. A GaN crystal doped with O of $7.5 \times 10^{16}$ cm$^{-3}$ was grown on seed crystal substrate Ep in Example 11. A GaN crystal doped with Si of $7.2 \times 10^{18}$ cm$^{-3}$ was grown on seed crystal substrate Gp in Example 12. The concentration of each type of dopant in the GaN crystal of each example is as shown in Table 3.

Likewise with Comparative Example 1, the crystal growth rate was 100 μm/hr for all Examples 8-12. A GaN crystal of approximately 10 mm in thickness was obtained by conducting crystal growth for 100 hours. Polycrystalline GaN of approximately 0.2 μm to 1 mm adhered partially to the outer circumference of the obtained GaN crystal. In a manner similar to that described above, the GaN crystal was subjected to the processes of removing the crystal adhering to the outer circumference, slicing, and rinsing. Seven GaN crystal substrates, each of 350 μm in thickness, were obtained.

The crack generation rate at the GaN crystal substrate calculated from equation (6) was 43% for Examples 8 and 10, and 29% for Examples 9, 11 and 12. Further, the increased thermal expansion coefficient $\Delta\lambda_{GaN(A2)}$ of each GaN crystal obtained for Examples 8-12 was, from equation (4), calculated as $2.3\times10^{-12}$ °C.$^{-1}$ (Example 8), $2.9\times10^{-10}$ °C.$^{-1}$ (Example 9), $2.7\times10^{-12}$ °C.$^{-1}$ (Example 10), $4.9\times10^{-12}$ °C.$^{-1}$ (Example 11), and $9.9\times10^{-12}$ °C.$^{-1}$ (Example 12). Therefore, the difference $\Delta\lambda$ of increased thermal expansion coefficient $\Delta\lambda_{GaN(A1)}$ of each GaN seed crystal substrate to increased thermal expansion coefficient $\Delta\lambda_{GaN(A2)}$ of each GaN crystal was, from equation (5), calculated as $6.5\times10^{-12}$ °C.$^{-1}$ for Example 8, $1.8\times10^{-10}$ °C.$^{-1}$ for Example 9, $3.2\times10^{-12}$ °C.$^{-1}$ for Example 10, $3.9\times10^{-12}$ °C.$^{-1}$ for Example 11, and $4.6\times10^{-10}$ °C.$^{-1}$ for Example 12. The results are shown in Table 3.

TABLE 2

| | Homo-epitaxial growth | Comparative Example 1 | Example 1 | Example 2 | Example 3 | Example 4 | Example 5 | Example 6 | Example 7 |
|---|---|---|---|---|---|---|---|---|---|
| GaN Seed Crystal Substrate | Substrate designation | Seed crystal substrate Ap | Seed crystal substrate Bp | Seed crystal substrate Cp | Seed crystal substrate Dp | Seed crystal substrate Ep | Seed crystal substrate Fp | Seed crystal substrate Gp | Seed crystal substrate Hp |
| | Presence of polycrystalline region | none | none | none | none | none | none | none | none |
| | First dopant Type | none | In | Al | P | As | Sb | O | Si |
| | Concentration (cm$^{-3}$) | — | $2.4 \times 10^{18}$ | $5.3 \times 10^{17}$ | $1.4 \times 10^{18}$ | $7.5 \times 10^{16}$ | $3.7 \times 10^{16}$ | $7.2 \times 10^{18}$ | $4.3 \times 10^{18}$ |
| | Increased thermal expansion coefficient $\Delta\lambda_{GaN(A1)}$ (° C.$^{-1}$) | 0 | $6.9 \times 10^{-11}$ | $5.1 \times 10^{-11}$ | $9.5 \times 10^{-11}$ | $8.8 \times 10^{-12}$ | $7.7 \times 10^{-12}$ | $4.7 \times 10^{-10}$ | $5.9 \times 10^{-12}$ |
| GaN Crystal | Second dopant Type | none | none | none | none | none | none | none | none |
| | Concentration (cm$^{-3}$) | — | — | — | — | — | — | — | — |
| | Increased thermal expansion coefficient $\Delta\lambda_{GaN(A2)}$ (° C.$^{-1}$) | 0 | 0 | 0 | 0 | 0 | 0 | 0 | 0 |
| | Difference in thermal expansion coefficient $\Delta\lambda$ (° C.$^{-1}$) | 0 | $6.9 \times 10^{-11}$ | $5.1 \times 10^{-11}$ | $9.5 \times 10^{-11}$ | $8.8 \times 10^{-12}$ | $7.7 \times 10^{-12}$ | $4.7 \times 10^{-10}$ | $5.9 \times 10^{-12}$ |
| | Number of obtained substrates | 7 | 7 | 7 | 7 | 7 | 7 | 7 | 7 |
| | Number of substrates with cracks | 6 | 2 | 2 | 2 | 2 | 2 | 1 | 2 |
| | Crack generation rate (%) | 86 | 29 | 29 | 29 | 29 | 29 | 14 | 29 |

TABLE 3

| | Homo-epitaxial Growth | Example 8 | Example 9 | Example 10 | Example 11 | Example 12 |
|---|---|---|---|---|---|---|
| GaN Seed Crystal Substrate | Substrate designation | Seed crystal substrate Ep | Seed crystal substrate Gp | Seed crystal substrate Hp | Seed crystal substrate Ep | Seed crystal substrate Gp |
| | Presence of polycrystalline region | none | none | none | none | none |
| | First dopant Type | As | O | Si | As | O |
| | Concentration (cm$^{-3}$) | $7.5 \times 10^{16}$ | $7.2 \times 10^{18}$ | $4.3 \times 10^{18}$ | $7.5 \times 10^{16}$ | $7.2 \times 10^{18}$ |
| | Increased thermal expansion coefficient $\Delta\lambda_{GaN(A1)}$ (° C.$^{-1}$) | $8.8 \times 10^{-12}$ | $4.7 \times 10^{-10}$ | $5.9 \times 10^{-12}$ | $8.8 \times 10^{-12}$ | $4.7 \times 10^{-10}$ |
| GaN Crystal | Second dopant Type | As | O | Si | O | Si |
| | Concentration (cm$^{-3}$) | $2.0 \times 10^{16}$ | $4.5 \times 10^{18}$ | $2.0 \times 10^{18}$ | $7.5 \times 10^{16}$ | $7.2 \times 10^{18}$ |
| | Increased thermal expansion coefficient $\Delta\lambda_{GaN(A2)}$ (° C.$^{-1}$) | $2.3 \times 10^{-12}$ | $2.9 \times 10^{-10}$ | $2.7 \times 10^{-12}$ | $4.9 \times 10^{-12}$ | $9.9 \times 10^{-12}$ |
| | Difference in thermal expansion coefficient $\Delta\lambda$ (° C.$^{-1}$) | $6.5 \times 10^{-12}$ | $1.8 \times 10^{-10}$ | $3.2 \times 10^{-12}$ | $3.9 \times 10^{-12}$ | $4.6 \times 10^{-10}$ |
| | Number of obtained substrates | 7 | 7 | 7 | 7 | 7 |
| | Number of substrates with cracks | 3 | 2 | 3 | 2 | 2 |
| | Crack generation rate (%) | 43 | 29 | 43 | 29 | 29 |

Referring to Table 2, it is appreciated from Comparative Example 1 and Examples 1-7 that a thick GaN crystal can be grown with the generation of a crack suppressed by growing a GaN crystal on a GaN seed crystal substrate having the first dopant added such that the thermal expansion coefficient of the GaN seed crystal substrate is greater than that of the GaN crystal. Referring to Tables 2 and 3, it is apparent from Comparative Example 1 and Examples 8-12 that a thick GaN crystal can be grown with the generation of a crack suppressed by growing a GaN crystal added with the second dopant on a GaN seed crystal substrate added with the first dopant such that the thermal expansion coefficient of the GaN seed crystal substrate is greater than that of the GaN crystal.

Examples 13-22

1. Preparation of GaN Seed Crystal Substrate

Referring to FIGS. 3, 8A, 8B and 9, a GaAs substrate of 50.8 mm in diameter, qualified as an underlying substrate 90, was disposed, and a cylindrical solid carbon material of 10 mm in width $W_o$, qualified as polycrystallization material 91, was disposed in contact with outer circumferential face 90$r$ of the GaAs substrate, constituting substrate 100 on susceptor 55 in crystal growth vessel 51 of crystal growth apparatus 50. Then, underlying layer 90 and polycrystallization material 91 were heated to 1000° C. With a hydrogen atmosphere of 101.3 kPa (1.0 atm) in total pressure using $H_2$ gas as the carrier gas, Ga chloride gas 5 (partial pressure: 2.03 kPa (0.02 atm)) and $NH_3$ gas 6 (partial pressure: 30.4 kPa (0.3 atm)) were introduced into crystal growth vessel 51 to grow a GaN seed crystal 10 (seed crystal I). In the case where doping is to be effected, dopant gas 7 was further introduced as set forth below to grow a GaN seed crystal (seed crystals J-M).

Each dopant of the GaN seed crystal was added in a manner similar to that of the first embodiment. For doping As (seed crystal J), powder of GaAs were mixed with Ga 5. For doping Al (seed crystal K), the mixture gas of TMA gas and HCl gas, qualified as dopant gas 7, was introduced. For doping O (seed crystal L) and Si (seed crystal M), $O_2$ gas and $SiH_4$ gas, respectively, qualified as dopant gas 7, were introduced. The employed powder of GaAs had the average grain size of 0.5 μm and below.

Referring to FIGS. 3, 10A, 10B and 11, a GaAs substrate of 50.8 mm in diameter, qualified as underlying substrate 90, and a solid carbon material of 70.8 mm in diameter, qualified as polycrystallization material 91 with an outer circumferential face 91$r$ of a diameter greater than that of outer circumferential face 90$r$ of the GaAs substrate, were disposed, constituting substrate 100, on susceptor 55 in crystal growth vessel 51 of crystal growth apparatus 50. The solid carbon material was disposed below the GaAs substrate, and located so that the width $W_0$ of this solid carbon material protruding from the outer perimeter of the substrate was 10 mm. Then, a GaN seed crystal (seed crystal N) was grown under conditions similar to those of seed crystal L while introducing $O_2$ gas as the dopant gas over the GaAs substrate (underlying substrate 90) and the solid carbon material (polycrystallization material 91). The results are shown in Table 4.

Referring to FIGS. 3, 12A, 12B and 13, a GaAs substrate of 50.8 mm in diameter having a work-affected layer of 10 mm in width $W_0$ at the outer circumference, qualified as underlying layer 90, was disposed, constituting substrate 100, on susceptor 55 in crystal growth vessel 51 of crystal growth apparatus 50. This GaAs substrate can be obtained by working on the outer circumference of the GaAs substrate of 52 mm in diameter using a grindstone having SiC abrasive grains of 10 μm in grain size embedded. Then, a GaN seed crystal (seed crystal O) was grown under conditions similar to those of seed crystal L while introducing $O_2$ gas as the dopant gas on the GaAs substrate (underlying substrate 90) with a work-affected layer. The results are shown in Table 4.

Following the growth of GaN seed crystal 10, the width $W_1$ of polycrystalline region 10$b$ was adjusted by working on the outer circumference of GaN seed crystal 10. GaN seed crystal 10 having the width $W_1$ of polycrystalline region 10$b$ adjusted was sliced at planes 10$sp$ and 10$tp$ parallel to main surface 90$s$ of underlying substrate 90 (refer to FIG. 11).

Referring to FIGS. 9, 11 and 13, a monocrystalline region 10$a$ was formed on underlying substrate 90 (excluding work-affected layer 90$t$), and polycrystalline region 10$b$ was formed on polycrystallization material 91 or work-affected layer 90$t$ by the crystal growth set forth above. Thus, a GaN seed crystal 10 having a polycrystalline region 10$b$ of a width $W_1$ of 10 mm at the outer circumference was grown.

Referring to FIGS. 9, 11 and 13, this GaN seed crystal 10 was subjected to any of the three outer circumference processing methods set forth in the first embodiment, and then sliced at planes 10$sp$ and 10$tp$ parallel to main surface 90$s$ of underlying substrate 90. The surface was rinsed with hydrochloric acid (acid) KOH, NaOH (alkali) and ethanol (organic solvent). Thus, a GaN seed crystal substrate 10$p$ of 1000 μm in thickness, including a polycrystalline region of 1 mm in width $W_1$ at the outer circumference and a monocrystalline region 10$a$ of a diameter $D_1$ of 50 mm, was obtained. Upon comparing seed crystals A-H with seed crystals I-O, it is appreciated that diameter $D_1$ of monocrystalline region 10$a$ is larger in size by seed crystals I-O (diameter 50 mm) than by seed crystals A-H (diameter 38 mm), although an underlying substrate with the same diameter 50.8 mm was employed. This is because crystal growth suppression material 92 to prevent formation of polycrystalline was employed in seed crystals A-H.

The processing conditions of the three outer circumference processing methods are set forth below. In a cylindrical grinding method, a diamond cup wheel having diamond abrasive grains of 20 μm in size embedded was used as the grindstone. The table forwarding rate was 0.5-1 mm/min; the work revolution speed was 10±2 rpm, and the crystal clamp pressure was 490 kPa (5 kgf/cm$^2$). In the substrate hollowing method, a diamond electrolytic-deposited drill having diamond abrasive grains of 15 μm in grain size embedded was employed as a drill. Using a soluble coolant, the crystal was secured at a holder by wax. The grindstone rotation speed was 5000-8000 rpm, and the working rate was 0.5-30 mm/min. In the electric discharging method, the wire diameter was 20 mm, the wire material was brass, the wire tension was 7N, the average working voltage was 40V, and the working rate was 1.0 to 2.0 mm/min.

The In, P, Al, As, Sb, O and Si dopant concentrations of each obtained GaN seed crystal substrate 10$p$ were all at most $1 \times 10^{16}$ cm$^{-3}$ for seed crystal substrate Ip (substrate obtained from seed crystal I, the same applies hereinafter). For seed crystal substrate Jp (substrate obtained from seed crystal J, the same applies hereinafter), the As concentration was $7.5 \times 10^{16}$ cm$^{-3}$. For seed crystal substrate Kp (substrate obtained from seed crystal K, the same applies hereinafter), the Al concentration was $5.3 \times 10^{17}$ cm$^{-3}$. For seed crystal substrate Lp (substrate obtained from seed crystal L, the same applies hereinafter), the O concentration was $7.2 \times 10^{18}$ cm$^{-3}$. For seed crystal substrate Mp (substrate obtained from seed crystal M, the same applies hereinafter), the Si concentration was $4.3 \times 10^{18}$ cm$^{-3}$. For seed crystal substrate Np (substrate obtained from seed crystal N, the same applies hereinafter), the O concentration was $7.2\times10^{18}$ cm$^{-3}$. For seed crystal substrate Op (substrate obtained from seed crystal O, the same applies hereinafter), the O concentration was $7.2\times10^{18}$ cm$^{-3}$.

The increased thermal expansion coefficient $\Delta\lambda_{GaN(A1)}$ of each obtained GaN seed crystal substrate 10p was calculated using equation (3). The increased thermal expansion coefficient $\Delta\lambda_{GaN(A1)}$ for seed crystal substrate Ip was 0° C.$^{-1}$, for seed crystal substrate Jp $8.8\times10^{-12}$° C.$^{-1}$, for seed crystal substrate Kp $5.1\times10^{-11}$° C.$^{-1}$, for seed crystal substrate Lp $4.7\times10^{-10}$° C.$^{-1}$, for seed crystal substrate Mp $5.9\times10^{-12}$° C.$^{-1}$, for seed crystal substrate Np $4.7\times10^{-10}$° C.$^{-1}$, and for seed crystal substrate Op $4.7\times10^{-10}$° C.$^{-1}$. The results are indicated in Table 4.

Referring to FIGS. 7A and 7B, such GaN crystal 20 had a monocrystalline region 20a and a polycrystalline region 20b grown on monocrystalline region 10a and polycrystalline region 10b, respectively, of GaN seed crystal substrate 10p. Monocrystalline region 20a had a diameter of 50 mm and polycrystalline region 20b had a width of 1 mm in GaN crystal 20. The GaN crystal was subjected to the processes of removing the crystal adhering to the outer circumference, slicing, and rinsing in a manner similar to that described above. Seven GaN crystal substrates, each of 350 μm in thickness, were obtained. The crack generation rate of the GaN crystal substrates was 29%, which is low.

The increased thermal expansion coefficient $\Delta\lambda_{GaN(A2)}$ of the GaN crystal obtained in Example 13 was 0 from equation

TABLE 4

| GaN Seed Crystal Substrate | Substrate designation | Seed crystal substrate Ip | Seed crystal substrate Jp | Seed crystal substrate Kp | Seed crystal substrate Lp | Seed crystal substrate Mp | Seed crystal substrate Np | Seed crystal substrate Op |
|---|---|---|---|---|---|---|---|---|
| | Type of underlying substrate | GaAs | GaAs | GaAs | GaAs | GaAs | GaAs | GaAs |
| | Presence of polycrystalline region | present | present | present | present | present | present | present |
| | First dopant Type | none | As | Al | O | Si | O | O |
| | Concentration (cm$^{-3}$) | — | $7.5\times10^{16}$ | $5.3\times10^{17}$ | $7.2\times10^{18}$ | $4.3\times10^{18}$ | $7.2\times10^{18}$ | $7.2\times10^{18}$ |
| | Increased thermal expansion coefficient $\Delta\lambda_{GaN(A1)}$ (° C.$^{-1}$) | 0 | $8.8\times10^{-12}$ | $5.1\times10^{-11}$ | $4.7\times10^{-10}$ | $5.9\times10^{-12}$ | $4.7\times10^{-10}$ | $4.7\times10^{-10}$ |
| | Number of obtained substrates | 7 | 7 | 7 | 7 | 7 | 7 | 7 |
| | Number of substrates with cracks | 1 | 2 | 1 | 1 | 2 | 2 | 2 |
| | Crack generation rate (%) | 14 | 29 | 14 | 14 | 29 | 29 | 29 |

2. Removal of Work-Affected Layer at Surface of GaN Seed Crystal Substrate

Referring to FIG. 3, a GaN seed crystal substrate 10p having a monocrystalline region 10a of 50 mm in diameter $D_1$ and a polycrystalline region 10b of 1 mm in width $W_1$, qualified as substrate 100, was placed on susceptor 55 in crystal growth vessel 51 of crystal growth apparatus 50, and heated to 950° C. With a hydrogen atmosphere of 101.3 kPa (1 atm) in total pressure using H$_2$ gas as the carrier gas, HCl gas (partial pressure: 70.9 kPa (0.7 atm)) was introduced into crystal growth vessel 51 to remove the work-affected layer from the surface of the GaN seed crystal substrate.

3. Growth of GaN Crystal

For Example 13 with reference to FIG. 3, a seed crystal substrate Ip (GaN seed crystal substrate 10p) having a monocrystalline region 10a of 50 mm in diameter and a polycrystalline region 10b of 1 mm in width $W_1$, having the work-affected layer removed from the surface, qualified as substrate 100, was placed on susceptor 55 in crystal growth vessel 51 of crystal growth apparatus 50, and heated to 1000° C. With a hydrogen atmosphere of 101.3 kPa (1.0 atm) in total pressure using H$_2$ gas as the carrier gas, Ga chloride gas 5 (partial pressure: 3.04 kPa (0.03 atm)) and NH$_3$ gas 6 (partial pressure: 13.7 kPa (0.135 atm)) were introduced to grow a GaN crystal. With regards to the crystal growth conditions, the crystal growth rate was 100 μm/hr. A GaN crystal of approximately 10 mm in thickness was obtained by conducting crystal growth for 100 hours.

(4). The difference $\Delta\lambda$ of increased thermal expansion coefficient $\Delta\lambda_{GaN(A1)}$ of seed crystal substrate Ap (GaN seed crystal substrate 10p) with respect to the increased thermal expansion coefficient $\Delta\lambda_{GaN(A2)}$ of GaN crystal 20 was 0 from equation (5). The results are shown in Table 5.

Respective GaN crystals were grown in a manner similar to that of Example 13, provided that seed crystal substrate Ip (Example 14), seed crystal substrate Kp (Example 15), seed crystal substrate Lp (Example 16), seed crystal substrate Mp (Example 17), seed crystal substrate Jp (Example 18), seed crystal substrate Kp (Example 19), seed crystal substrate Lp (Example 20), seed crystal substrate Np (Example 21), and seed crystal substrate Op (Example 22) were employed, instead of seed crystal substrate Ip (Example 13), for the GaN seed crystal substrate. In addition, the added dopant was As of $2.0\times10^{16}$ cm$^{-3}$ (Example 14), Al of $8.0\times10^{16}$ cm$^{-3}$ (Example 15), O of $4.5\times10^{18}$ cm$^{-3}$ (Example 16), Si of $2.0\times10^{18}$ cm$^{-3}$ (Example 17), O of $7.5\times10^{16}$ cm$^{-3}$ (Example 18), P of $5.3\times10^{17}$ cm$^{-3}$ (Example 19), Si of $7.2\times10^{18}$ cm$^{-3}$ (Example 20), Si of $7.2\times10^{18}$ cm$^{-3}$ (Example 21), and Si of $7.2\times10^{18}$ cm$^{-3}$ (Example 22).

In a manner similar to that described above, the GaN crystal was subjected to the processes of removing the crystal adhering to the outer circumference, slicing, and rinsing. Seven GaN crystal substrates, each of 350 μm in thickness, were obtained. The crack generation rate of the GaN crystal substrates was 14% for Examples 14, 15, 17 and 19-22, and 0% for Examples 16 and 18.

In addition, the increased thermal expansion coefficient $\Delta\lambda_{GaN(A2)}$ of each GaN crystal obtained in Examples 14-22 was, from equation (4), calculated as $2.3\times10^{-12}$° C.$^{-1}$ (Example 14), $7.7\times10^{-12}$° C.$^{-1}$ (Example 15), $2.9\times10^{-10}$° C.$^{-1}$ (Example 16), $2.7 \times 10^{-12}$ °C.$^{-1}$ (Example 17), $4.9 \times 10^{-12}$ °C.$^{-1}$ (Example 18), $3.6 \times 10^{-11}$ °C.$^{-1}$ (Example 19), $9.9 \times 10^{-12}$ °C.$^{-1}$ (Example 20), $9.9 \times 10^{-12}$ °C.$^{-1}$ (Example 21), and $9.9 \times 10^{-12}$ °C.$^{-1}$ (Example 22). Therefore, the difference Δλ of increased thermal expansion coefficient $\Delta\lambda_{GaN(A1)}$ of each GaN seed crystal substrate to increased thermal expansion coefficient $\Delta\lambda_{GaN(A2)}$ to each GaN crystal was, by equation (5), calculated as $6.5 \times 10^{-12}$ °C.$^{-1}$ for Example 14, $4.3 \times 10^{-11}$ °C.$^{-1}$ for Example 15, $1.8 \times 10^{-11}$ °C.$^{-1}$ for Example 16, $3.2 \times 10^{-12}$ °C.$^{-1}$ for Example 17, $3.9 \times 10^{-12}$ °C.$^{-1}$ for Example 18, $1.5 \times 10^{-11}$ °C.$^{-1}$ for Example 19, $4.6 \times 10^{-10}$ °C.$^{-1}$ for Example 20, $4.6 \times 10^{-10}$ °C.$^{-1}$ for Example 21, and $4.6 \times 10^{-10}$ °C.$^{-1}$ for Example 22. The results are shown in Table 5.

TABLE 5

| | Homo-epitaxial growth | | Example 13 | Example 14 | Example 15 | Example 16 | Example 17 |
|---|---|---|---|---|---|---|---|
| GaN Seed Crystal Substrate | Substrate designation | | Seed crystal substrate Ip | Seed crystal substrate Jp | Seed crystal substrate Kp | Seed crystal substrate Lp | Seed crystal substrate Mp |
| | Presence of polycrystalline region | | present | present | present | present | present |
| | First dopant | Type | none | As | Al | O | Si |
| | | Concentration (cm$^{-3}$) | — | $7.5 \times 10^{16}$ | $5.3 \times 10^{17}$ | $7.2 \times 10^{18}$ | $4.3 \times 10^{18}$ |
| | Increased thermal expansion coefficient $\Delta\lambda_{GaN(A1)}$ (° C.$^{-1}$) | | 0 | $8.8 \times 10^{-12}$ | $5.1 \times 10^{-11}$ | $4.7 \times 10^{-10}$ | $5.9 \times 10^{-12}$ |
| GaN Crystal | Second dopant | Type | none | As | Al | O | Si |
| | | Concentration (cm$^{-3}$) | — | $2.0 \times 10^{16}$ | $8.0 \times 10^{16}$ | $4.5 \times 10^{18}$ | $2.0 \times 10^{18}$ |
| | Increased thermal expansion coefficient $\Delta\lambda_{GaN(A2)}$ (° C.$^{-1}$) | | 0 | $2.3 \times 10^{-12}$ | $7.7 \times 10^{-12}$ | $2.9 \times 10^{-10}$ | $2.7 \times 10^{-12}$ |
| | Difference in thermal expansion coefficient Δλ (° C.$^{-1}$) | | 0 | $6.5 \times 10^{-12}$ | $4.3 \times 10^{-11}$ | $1.8 \times 10^{-10}$ | $3.2 \times 10^{-12}$ |
| | Number of obtained substrates | | 7 | 7 | 7 | 7 | 7 |
| | Number of substrates with cracks | | 2 | 1 | 1 | 0 | 1 |
| | Crack generation rate (%) | | 29 | 14 | 14 | 0 | 14 |

| | Homo-epitaxial growth | | Example 18 | Example 19 | Example 20 | Example 21 | Example 22 |
|---|---|---|---|---|---|---|---|
| GaN Seed Crystal Substrate | Substrate designation | | Seed crystal substrate Jp | Seed crystal substrate Kp | Seed crystal substrate Lp | Seed crystal substrate Np | Seed crystal substrate Op |
| | Presence of polycrystalline region | | present | present | present | present | present |
| | First dopant | Type | As | Al | O | O | O |
| | | Concentration (cm$^{-3}$) | $7.5 \times 10^{16}$ | $5.3 \times 10^{17}$ | $7.2 \times 10^{18}$ | $7.2 \times 10^{18}$ | $7.2 \times 10^{18}$ |
| | Increased thermal expansion coefficient $\Delta\lambda_{GaN(A1)}$ (° C.$^{-1}$) | | $8.8 \times 10^{-12}$ | $5.1 \times 10^{-11}$ | $4.7 \times 10^{-10}$ | $4.7 \times 10^{-10}$ | $4.7 \times 10^{-10}$ |
| GaN Crystal | Second dopant | Type | O | P | Si | Si | Si |
| | | Concentration (cm$^{-3}$) | $7.5 \times 10^{16}$ | $5.3 \times 10^{17}$ | $7.2 \times 10^{18}$ | $7.2 \times 10^{18}$ | $7.2 \times 10^{18}$ |
| | Increased thermal expansion coefficient $\Delta\lambda_{GaN(A2)}$ (° C.$^{-1}$) | | $4.9 \times 10^{-12}$ | $3.6 \times 10^{-11}$ | $9.9 \times 10^{-12}$ | $9.9 \times 10^{-12}$ | $9.9 \times 10^{-12}$ |
| | Difference in thermal expansion coefficient Δλ (° C.$^{-1}$) | | $3.9 \times 10^{-12}$ | $1.5 \times 10^{-11}$ | $4.6 \times 10^{-10}$ | $4.6 \times 10^{-10}$ | $4.6 \times 10^{-10}$ |
| | Number of obtained substrates | | 7 | 7 | 7 | 7 | 7 |
| | Number of substrates with cracks | | 0 | 1 | 1 | 1 | 1 |
| | Crack generation rate (%) | | 0 | 14 | 14 | 14 | 14 |

Referring to Tables 1 and 5, it is appreciated from Comparative Example 1 and Example 13 that a thick GaN crystal can be grown with the generation of a crack suppressed by growing a GaN crystal on a GaN seed crystal substrate having a polycrystalline region at the outer circumference. In addition, referring to Table 5, it is appreciated from Examples 13-22 that a thick GaN crystal can be grown with the generation of a crack further suppressed by growing a GaN crystal having the second dopant added on a GaN seed crystal substrate with a polycrystalline region at the outer circumferential region, and having the first dopant added so that the thermal expansion coefficient of the GaN seed crystal substrate is greater than that of the GaN crystal.

Examples 23-28

1. Preparation of GaN Seed Crystal Substrate

The outer circumference of GaN seed crystal 10 employed in Example 20, containing the O dopant at the concentration of $7.2 \times 10^{18}$ cm$^{-3}$, and including a monocrystalline region of 50 mm in diameter $D_1$ and a polycrystalline region 10b of 10 mm in width $W_1$ at the outer circumference, was worked by an outer circumference processing method similar to that of Example 20 to adjust width $W_1$ of the polycrystalline region. The crystal was sliced at planes 10sp and 10tp parallel to main surface 90s of underlying substrate 90. The surface was rinsed with hydrochloric acid (acid) KOH, NaOH (alkali) and ethanol (organic solvent). Thus, a GaN seed crystal substrate 10p of 1000 μm in thickness, including a polycrystalline region of respective width $W_1$ at the outer circumference was obtained. The width $W_1$ was 0.03 mm (Example 23), 0.05 mm (Example 24), 0.1 mm (Example 25), 1.0 mm (Example 20A), 2.0 mm (Example 26), 5.0 mm (Example 27), and 10.0 mm (Example 28).

2. Removal of Work-Affected Layer from Surface of GaN Seed Crystal Substrate

In a manner similar to that of Example 20, the work-affected layer at GaN seed crystal substrate 10p was removed.

3. Growth of GaN Crystal

A GaN crystal was grown on GaN seed crystal substrate 10p to obtain a GaN crystal of approximately 10 mm in thickness, in a manner similar to that of Example 20, provided that the applied amount of Si was $4.3 \times 10^{18}$ cm$^{-3}$. The GaN crystal was subjected to the processes of removing the crystal adhering to the outer circumference, slicing, and rinsing in a manner similar to that described above. Seven GaN crystal substrates, each of 350 μm in thickness, were obtained. The crack generation rate of the GaN crystal substrates was 29% for Examples 23, 24, and 28, 14% for Examples 25 and 20A, and 0% for Examples 26 and 27. The increased thermal expansion coefficient $\Delta\lambda_{GaN(A2)}$ of each GaN crystal obtained in Examples 23-28 was calculated as $5.9 \times 10^{-12}$ ° C.$^{-1}$ from equation (4). Therefore, the difference $\Delta\lambda$ of increased thermal expansion coefficient $\Delta\lambda_{GaN(A1)}$ of each GaN seed crystal substrate with respect to the increased thermal expansion coefficient $\Delta\lambda_{GaN(A2)}$ of each GaN crystal was calculated as $4.6 \times 10^{-10}$ ° C.$^{-1}$ from equation (5). The results are shown in Table 6.

TABLE 6

| | Homo-epitaxial growth | | Example 23 | Example 24 | Example 25 | Example 20A | Example 26 | Example 27 | Example 28 |
|---|---|---|---|---|---|---|---|---|---|
| GaN Seed Crystal Substrate | Substrate designation | | Seed crystal substrate Lp | Seed crystal substrate Lp | Seed crystal substrate Lp | Seed crystal substrate Lp | Seed crystal substrate Lp | Seed crystal substrate Lp | Seed crystal substrate Lp |
| | Presence of polycrystalline region | | present | present | present | present | present | present | present |
| | First dopant | Type | O | O | O | O | O | O | O |
| | | Concentration (cm$^{-3}$) | $7.2 \times 10^{18}$ | $7.2 \times 10^{18}$ | $7.2 \times 10^{18}$ | $7.2 \times 10^{18}$ | $7.2 \times 10^{18}$ | $7.2 \times 10^{18}$ | $7.2 \times 10^{18}$ |
| | Polycrystalline region width $W_1$ (mm) | | 0.03 | 0.05 | 0.1 | 1 | 2 | 5 | 10 |
| | Increased thermal expansion coefficient $\Delta\lambda_{GaN(A1)}$ (° C.$^{-1}$) | | $4.7 \times 10^{-10}$ | $4.7 \times 10^{-10}$ | $4.7 \times 10^{-10}$ | $4.7 \times 10^{-10}$ | $4.7 \times 10^{-10}$ | $4.7 \times 10^{-10}$ | $4.7 \times 10^{-10}$ |
| GaN Crystal | Second dopant | Type | Si | Si | Si | Si | Si | Si | Si |
| | | Concentration (cm$^{-3}$) | $4.3 \times 10^{18}$ | $4.3 \times 10^{18}$ | $4.3 \times 10^{18}$ | $4.3 \times 10^{18}$ | $4.3 \times 10^{18}$ | $4.3 \times 10^{18}$ | $4.3 \times 10^{18}$ |
| | Increased thermal expansion coefficient $\Delta\lambda_{GaN(A2)}$ (° C.$^{-1}$) | | $5.9 \times 10^{-12}$ | $5.9 \times 10^{-12}$ | $5.9 \times 10^{-12}$ | $5.9 \times 10^{-12}$ | $5.9 \times 10^{-12}$ | $5.9 \times 10^{-12}$ | $5.9 \times 10^{-12}$ |
| | Difference in thermal expansion coefficient $\Delta\lambda$ (° C.$^{-1}$) | | $4.6 \times 10^{-10}$ | $4.6 \times 10^{-10}$ | $4.6 \times 10^{-10}$ | $4.6 \times 10^{-10}$ | $4.6 \times 10^{-10}$ | $4.6 \times 10^{-10}$ | $4.6 \times 10^{-10}$ |
| | Number of obtained substrates | | 7 | 7 | 7 | 7 | 7 | 7 | 7 |
| | Number of substrates with cracks | | 2 | 2 | 1 | 1 | 0 | 0 | 2 |
| | Crack generation rate (%) | | 29 | 29 | 14 | 14 | 0 | 0 | 29 |

Referring to Table 6, it is appreciated from Examples 20 and 23-28 that the crack generation rate of the GaN crystal was reduced to 29% and below by growing a GaN crystal on a GaN seed crystal substrate having a polycrystalline region of at least 0.03 mm and not more than 10 mm in width $W_1$ at the outer circumference. Furthermore, by growing a GaN crystal on a GaN seed crystal substrate having a polycrystalline region of at least 0.1 mm and not more than 5 mm in width $W_1$ at the outer circumference, the crack generation rate of the GaN crystal was reduced to 14% and below.

Examples 29-33

GaN seed crystal substrates having the O dopant concentration and increased thermal expansion coefficient $\Delta\lambda_{GaN(A1)}$ of $5.2\times10^{15}$ cm$^{-3}$ and $3.4\times10^{-13}$ °C.$^{-1}$, respectively (Example 29), $9.0\times10^{16}$ cm$^{-3}$ and $5.9\times10^{-12}$ °C.$^{-1}$, respectively (Example 30), $6.0\times10^{17}$ cm$^{-3}$ and $3.9\times10^{-11}$ °C.$^{-1}$, respectively (Example 31), $3.0\times10^{19}$ cm$^{-3}$ and $2.0\times10^{-9}$ °C.$^{-1}$, respectively (Example 32), $5.5\times10^{19}$ cm$^{-3}$ and $3.6\times10^{-9}$ °C.$^{-1}$, respectively (Example 33), and including a monocrystalline region of 50 mm in diameter and a polycrystalline region of 1 mm in width $W_1$ adjacent to the outer circumference, were prepared.

Following the removal of a work-affected layer from the surface of the GaN seed crystal substrate, a GaN crystal having the Si dopant of $2.0\times10^{15}$ cm$^{-3}$ (Example 29), $6.0\times10^{16}$ cm$^{-3}$ (Example 30), $3.0\times10^{17}$ cm$^{-3}$ (Example 31), $6.0\times10^{18}$ cm$^{-3}$ (Example 32), and $8.0\times10^{18}$ cm$^{-3}$ (Example 33) added was grown thereon to obtain a GaN crystal of approximately 10 mm in thickness. The crack generation rate of the GaN crystal was 14% for Examples 29-32 and 29% for Example 33.

In addition, the increased thermal expansion coefficient $\Delta\lambda_{GaN(A2)}$ of each GaN crystal obtained in Examples 29-33 was, from equation (4), calculated as $1.3\times10^{-13}$ °C.$^{-1}$ (Example 29), $3.9\times10^{-12}$ °C.$^{-1}$ (Example 30), $2.0\times10^{-11}$ °C.$^{-1}$ (Example 31), $3.9\times10^{-10}$ °C.$^{-1}$ (Example 32), and $5.2\times10^{-10}$ °C.$^{-1}$ (Example 33). Therefore, the difference $\Delta\lambda$ of increased thermal expansion coefficient $\Delta\lambda_{GaN(A1)}$ of each GaN seed crystal substrate with respect to increased thermal expansion coefficient $\Delta\lambda_{GaN(A2)}$ of each GaN crystal was, from equation (5), calculated as $2.1\times10^{-13}$ °C.$^{-1}$ Example 29), $2.0\times10^{-12}$ °C.$^{-1}$ (Example 30), $2.0\times10^{-11}$ °C.$^{-1}$ (Example 31), $1.6\times10^{-9}$ °C.$^{-1}$ (Example 32) and $3.1\times10^{-9}$ °C.$^{-1}$ (Example 33). The results are shown in Table 7.

TABLE 7

| | Homo-epitaxial growth | Example 29 | Example 30 | Example 31 | Example 32 | Example 33 |
|---|---|---|---|---|---|---|
| GaN Seed Crystal Substrate | Substrate designation | Seed crystal substrate Lp | Seed crystal substrate Lp | Seed crystal substrate Lp | Seed crystal substrate Lp | Seed crystal substrate Lp |
| | Presence of polycrystaline region | present | present | present | present | present |
| | First Type | O | O | O | O | O |
| | dopant Concentration (cm$^{-3}$) | $5.2\times10^{15}$ | $9.0\times10^{16}$ | $6.0\times10^{17}$ | $3.0\times10^{19}$ | $5.5\times10^{19}$ |
| | Polycrystalline region width $W_1$ (mm) | 1 | 1 | 1 | 1 | 1 |
| | Increased thermal expansion coefficient $\Delta\lambda_{GaN(A1)}$ (°C.$^{-1}$) | $3.4\times10^{-13}$ | $5.9\times10^{-12}$ | $3.9\times10^{-11}$ | $2.0\times10^{-9}$ | $3.6\times10^{-9}$ |
| GaN Crystal | Second Type | O | O | O | O | O |
| | dopant Concentration (cm$^{-3}$) | $2.0\times10^{15}$ | $6.0\times10^{16}$ | $3.0\times10^{17}$ | $6.0\times10^{18}$ | $8.0\times10^{18}$ |
| | Increased thermal expansion coefficient $\Delta\lambda_{GaN(A2)}$ (°C.$^{-1}$) | $1.3\times10^{-13}$ | $3.9\times10^{-12}$ | $2.0\times10^{-11}$ | $3.9\times10^{-10}$ | $5.2\times10^{-10}$ |
| | Difference in thermal expansion coefficient $\Delta\lambda$ (°C.$^{-1}$) | $2.1\times10^{-13}$ | $2.0\times10^{-12}$ | $2.0\times10^{-11}$ | $1.6\times10^{-9}$ | $3.1\times10^{-9}$ |
| | Number of obtained substrates | 7 | 7 | 7 | 7 | 7 |
| | Number of substrates with cracks | 1 | 1 | 1 | 1 | 2 |
| | Crack generation rate (%) | 14 | 14 | 14 | 14 | 29 |

Referring to Table 7, it is appreciated from Examples 29-33 that the crack generation rate of the GaN crystal was reduced significantly by growing a GaN crystal on the GaN seed crystal substrate whose dopant concentration at the GaN seed crystal substrate is at least $5\times10^{15}$ cm$^{-3}$ and not more than $3\times10^{19}$ cm$^{-3}$.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A growth method of a GaN crystal, for growing a GaN crystal on a GaN seed crystal substrate, comprising the steps of:
    preparing said GaN seed crystal substrate including a first dopant such that a thermal expansion coefficient of said GaN seed crystal substrate becomes greater than the thermal expansion coefficient of said GaN crystal, and
    growing said GaN crystal to a thickness of at least 1 mm on said GaN seed crystal substrate, wherein
    said first dopant includes at least one type of element selected from the group consisting of In, P, Al, As, Sb and Si, and
    said first dopant has a concentration of at least $5\times10^{15}$ cm$^{-3}$ and not more than $5\times10^{19}$ cm$^{-3}$.

2. The growth method of a GaN crystal according to claim 1, wherein, in said step of growing said GaN crystal, a second dopant is added to said GaN crystal such that the thermal expansion coefficient of said GaN seed crystal substrate becomes greater than the thermal expansion coefficient of said GaN crystal.

3. The growth method of a GaN crystal according to claim 2, wherein said second dopant includes at least one type of element selected from the group consisting of In, P, Al, As, Sb, O and Si.

4. The growth method of a GaN crystal according to claim 3, wherein said first and second dopants include the same type of element.

5. The growth method of a GaN crystal according to claim 1, wherein said GaN seed crystal substrate is obtained by, using a substrate differing in a chemical composition from the chemical composition of GaN as an underlying substrate, disposing a crystal growth suppression material in contact with an outer circumferential face of said underlying substrate, growing a GaN seed crystal on said underlying substrate, and slicing said GaN seed crystal parallel to a main surface of said underlying substrate.

6. A GaN crystal substrate obtained by processing said GaN crystal obtained by the growth method of claim 1.

* * * * *